(12) United States Patent
Bourassa et al.

(10) Patent No.: US 10,013,657 B2
(45) Date of Patent: Jul. 3, 2018

(54) PERIODICAL MODULATION OF LONGITUDINAL COUPLING STRENGTH FOR QUANTUM NON-DEMOLITION QUBIT READOUT

(71) Applicant: SOCPRA Sciences et Génie s.e.c., Sherbrooke, QC OT (CA)

(72) Inventors: Jerome Bourassa, Sherbrooke, QC (CA); Alexandre Blais, Sherbrooke, QC (CA); Nicloas Didier, Saint Sulpice (FR)

(73) Assignee: SOCPRA Sciences et Génie s.e.c., Sherbrooke, QC (CA)

( * ) Notice: Subject to any disclaimer, the term of this patent is extended or adjusted under 35 U.S.C. 154(b) by 0 days.

(21) Appl. No.: 15/455,105

(22) Filed: Mar. 9, 2017

(65) Prior Publication Data

US 2017/0262765 A1 Sep. 14, 2017

Related U.S. Application Data

(60) Provisional application No. 62/305,778, filed on Mar. 9, 2016.

(51) Int. Cl.
*G11C 11/44* (2006.01)
*G06N 99/00* (2010.01)
(Continued)

(52) U.S. Cl.
CPC .......... *G06N 99/002* (2013.01); *G11C 11/44* (2013.01); *H01L 39/025* (2013.01); *H01L 39/223* (2013.01)

(58) Field of Classification Search
CPC ...... G11C 11/44; G06N 99/002; H01L 39/025
(Continued)

(56) References Cited

U.S. PATENT DOCUMENTS 6,838,694 B2    1/2005  Esteve et al.
7,437,533 B2 *  10/2008 Ichimura ............... B82Y 10/00
                                                          250/526
(Continued)

OTHER PUBLICATIONS

S. Haroche and J.-M. Raimond, "Exploring the Quantum: Atoms, Cavities, and Photons" (Oxford University Press, Oxford, 2006).
(Continued)

*Primary Examiner* — Harry W Byrne
(74) *Attorney, Agent, or Firm* — Gowling WLG (Canada) LLP; Benoit Yelle

(57) ABSTRACT

Method and circuit for reading a value $\hat{\sigma}_z$ stored in a quantum information unit (qubit) memory having a qubit frequency $\omega_a$, with a resonator defined by a resonator damping rate $\kappa$, a resonator frequency $\omega_r$, a resonator electromagnetic field characterized by $\hat{a}^\dagger$ and $\hat{a}$, a longitudinal coupling strength $g_z$, an output $\hat{a}_{out}$ and a longitudinal coupling $g_z\hat{\sigma}_z(\hat{a}^\dagger+\hat{a})$. At a quantum non-demolition (QND) longitudinal modulator, periodically modulating the longitudinal coupling strength $g_z$ with a signal of amplitude $\tilde{g}_z$ at least three (3) times greater than the resonator damping rate $\kappa$ and of frequency $\omega_m$ with $\omega_m+\kappa$ resonant with $\omega_r$, wherein the longitudinal coupling strength $g_z$ varies over time (t) in accordance with $g_z(t)=\bar{g}_z+\tilde{g}_z\cos(\omega_m t)$ with $\bar{g}_z$ representing an average value of $g_z$ and at a QND homodyne detector, measuring the value $\hat{\sigma}_z$ of the qubit memory from a phase reading of the output $\hat{\sigma}_{out}$.

20 Claims, 9 Drawing Sheets

(51) Int. Cl.
*H01L 39/02* (2006.01)
*H01L 39/22* (2006.01)

(58) Field of Classification Search
USPC .......................................................... 365/162
See application file for complete search history.

(56) References Cited

U.S. PATENT DOCUMENTS

| | | | | |
|---|---|---|---|---|
| 7,779,228 | B2* | 8/2010 | Ichimura | G06N 99/002 250/526 |
| 2007/0145348 | A1* | 6/2007 | Ichimura | B82Y 10/00 257/9 |
| 2009/0009165 | A1* | 1/2009 | Ichimura | B82Y 10/00 324/304 |
| 2014/0092467 | A1 | 4/2014 | Chuu et al. | |

OTHER PUBLICATIONS

M. A. Castellanos-Beltran, K. D. Irwin, G. C. Hilton, L. R. Vale, and K. W. Lehnert, "Amplification and squeezing of quantum noise with a tunable Josephson metamaterial", Nature Phys. 4, 929 (2008). https://arxiv.org/pdf/0806.0659.pdf.
N. Bergeal, F. Schackert, M. Metcalfe, R. Vijay, V. E. Manucharyan, L. Frunzio, D. E. Prober, R. J. Schoelkopf, S. M. Girvin, and M. H. Devoret, "Phase preserving amplification near the quantum limit with a Josephson Ring Modulator", Nature 465, 64 (2010). https://arxiv.org/pdf/0912.3407.pdf.
C. Eichler and A. Wallraff, "Controlling the dynamic range of a Josephson parametric amplifier", EPJ Quantum Technology 1:2. https://arxiv.org/pdf/1305.6583.pdf.
R. Vijay, D. H. Slichter, and I. Siddiqi, "Observation of quantum jumps in a superconducting artificial atom", Phys. Rev. Lett. 106, 110502 (2011). https://arxiv.org/pdf/1009.2969.pdf.
R. Vijay, C. Macklin, D. H. Slichter, S. J. Weber, K. W. Murch, R. Naik, A. N. Korotkov, and I. Siddiqi, "Quantum feedback control of a superconducting qubit: Persistent Rabi oscillations", Nature 490, 77 (2012). https://arxiv.org/pdf/1205.5591.pdf.
M. Hatridge, S. Shankar, M. Mirrahimi, F. Schackert, K. Geerlings, T. Brecht, K. M. Sliwa, B. Abdo, L. Frunzio, S. M. Girvin, R. J. Schoelkopf, and M. H. Devoret, "Quantum Back-Action of an Individual Variable-Strength Measurement", Science 339, 178 (2013). http://science.sciencemag.org/content/339/6116/178?sid=870e6793-0ca5-45ec-800f-fa2c97ea8f03.
E. Jeffrey, D. Sank, J. Y. Mutus, T. C. White, J. Kelly, R. Barends, Y. Chen, Z. Chen, B. Chiaro, A. Dunsworth, A. Megrant, P. J. J. O'Malley, C. Neill, P. Roushan, A. Vainsencher, J. Wenner, A. N. Cleland, and J. M. Martinis, "Fast Accurate State Measurement with Superconducting Qubits", Phys. Rev. Lett. 112, 190504 (2014). https://arxiv.org/pdf/1401.0257.pdf.
R. Raussendorf and J. Harrington, "Fault-tolerant quantum computation with high threshold in two dimensions", Phys. Rev. Lett. 98, 190504 (2007). https://arxiv.org/pdf/quant-ph/0610082.pdf.
A. A. Houck, J. A. Schreier, B. R. Johnson, J. M. Chow, J. Koch, J. M. Gambetta, D. I. Schuster, L. Frunzio, M. H. Devoret, S. M. Girvin, and R. J. Schoelkopf, "Controlling the spontaneous emission of a superconducting transmon qubit", Phys. Rev. Lett. 101, 080502 (2008). https://arxiv.org/pdf/0803.4490.pdf.
M. Boissonneault, J. Gambetta, and A. Blais, "Dispersive regime of circuit QED: photon-dependent qubit dephasing and relaxation rates", Phys. Rev. A 79, 013819. https://arxiv.org/pdf/0810.1336.pdf.
D. H. Slichter, R. Vijay, S. J. Weber, S. Boutin, M. Boissonneault, J. M. Gambetta, a. Blais, and I. Siddiqi, "Measurement-induced qubit state mixing in circuit QED from up-converted dephasing noise", Phys. Rev. Lett. 109, 153601 (2012). https://doi.org/10.1103/PhysRevLett.109.153601.
A. Blais, R.-S. Huang, A. Wallra, S. Girvin, and R. Schoelkopf, "Cavity quantum electrodynamics for superconducting electrical circuits: An architecture for quantum computation", Phys. Rev. A 69, 062320 (2004). https://rsl.yale.edu/sites/default/files/physreva.69.pdf.cavity_quantum_electro.pdf.
A. J. Kerman, "Quantum information processing using quasiclassical electromagnetic interactions between qubits and electrical resonators", New Journal of Physics 15, 123011 (2013). http://iopscience.iop.org/article/10.1088/1367-2630/15/12/123011/pdf.
D.-M. Billangeon, J. S. Tsai, and Y. Nakamura, "Circuit-QED-based scalable architectures for quantum information processing with superconducting qubits", Phys. Rev. B 91, 094517 (2015). https://doi.org/10.1103/PhysRevB.91.094517.
S. Barzanjeh, D. P. DiVincenzo, and B. M. Terhal, "Dispersive Qubit Measurement by Interferometry with Parametric Amplifiers", Phys. Rev. B 90, 134515 (2014). https://arxiv.org/pdf/1407.3059.pdf.
N. Didier, A. Kamal, A. Blais, and A. A. Clerk "Heisenberg-limited qubit readout with two-mode squeezed light", ArXive-prints (2015). https://arxiv.org/pdf/1502.00607.pdf.
J. Koch, T. Yu, J. Gambetta, A. Houck, D. Schuster, J. Majer, A. Blais, M. Devoret, S. Girvin, and R. Schoelkopf, "Charge insensitive qubit design derived from the Cooper pair box", Phys. Rev. A 76, 042319 (2007). https://arxiv.org/pdf/cond-mat/0703002.pdf.
G. Milburn, S. Schneider, and D. James, "Ion Trap Quantum Computing with Warm Ions", Fortschritte der Physik 48, B01 (2000). http://iontrap.umd.edu/wp-content/uploads/2013/10/Ion-trap-quantum-computing-with-warm-ions.pdf.
A. Sorensen and K. Molmer, "Entanglement and quantum computation with ions in thermal motion", Phys. Rev. A 62, 022311 (2000). https://arxiv.org/pdf/quant-ph/0002024.pdf.
J. J. Garcia-Ripoll, P. Zoller, and J. I. Cirac, "Speed Optimized Two-Qubit Gates with Laser Coherent Control Techniques for Ion Trap Quantum Computing", Phys. Rev. Lett. 91, 157901 (2003). https://pdfs.semanticscholar.org/31f1/6173466f07a193d8454e32beb52738262866.pdf.
D. Leibfried, B. DeMarco, V. Meyer, D. Lucas, M. Barrett, J. Britton, W. M. Itano, B. Jelenkovic, C. Langer, T. Rosenband, and D. J. Wineland, "Experimental demonstration of a robust, high-fidelity geometric two ion-qubit phase fate", Nature 422, 412 (2003). https://pdfs.semanticscholar.org/17c8/7a75185648d4aa75798c9354fedccee01071.pdf.
A. Blais, J. Gambetta, A. Wallra, D. I. Schuster, S. M. Girvin, M. H. Devoret, and R. J. Schoelkopf, "Quantum-information processing with circuit quantum electrodynamics", Physical Review A (Atomic, Molecular, and Optical Physics) 75, 032329 (2007). https://qudev.phys.ethz.ch/content/science/papers/PhysRevA_75_032329-1.pdf.
K. Lalumière, J. M. Gambetta, and A. Blais, "Tunable joint measurements in the dispersive regime of cavity QED", Phys. Rev. A 81, 040301 (2010). https://journals.aps.org/pra/abstract/10.1103/PhysRevA.81.040301.
J. Gambetta, A. Blais, M. Boissonneault, A. A. Houck, D. I. Schuster, and S. M. Girvin, "Quantum trajectory approach to circuit QED: Quantum jumps and the Zeno effect", Phys. Rev. A 77, 012112 (2008). http://schusterlab.uchicago.edu/static/pdfs/Gambetta2008.pdf.
J. Bourassa, J. M. Gambetta, J. A. A. Abdumalikov, O. Astaev, Y. Nakamura, and A. Blais, "Ultrastrong coupling regime of cavity QED with phase biased flux qubits", Phys. Rev. A 80, 032109 (2009). https://arxiv.org/pdf/0906.1383v2.pdf.
V. E. Manucharyan, J. Koch, L. I. Glazman, and M. H. Devoret, "Fluxonium: Single Cooper-Pair Circuit Free of Charge Offsets", Science 326, 113 (2009). http://qulab.eng.yale.edu/documents/papers/Manucharyan%20et%20al,%20%20Fluxonium%20-%20Single%20Cooper-Pair%20Circuit%20Free%20of%20Charge%20Offsets.pdf.
D. Vion, A. Aassime, A. Cottet, P. Joyez, H. Pothier, C. Urbina, D. Esteve, and M. Devoret, "Manipulating the Quantum State of an Electrical Circuit", Science 296, 886 (2002). https://arxiv.org/pdf/cond-mat/0205343.pdf.
J. M. Fink, R. Bianchetti, M. Baur, M. Geippl, L. Steen, S. Filipp, P. J. Leek, A. Blais, and A. Wallra, "Dressed Collective Dubit States

(56) References Cited

OTHER PUBLICATIONS and the Tavis-Cummings Model in Circuit QED", Phys.Rev. Lett. 103, 083601 (2009). https://leeklab.physics.ox.ac.uk/documents/2009-Fink.pdf.
P.-M. Billangeon, J. S. Tsai, and Y. Nakamura, "Circuit-QED-based scalable architectures for quantum information processing with superconducting qubits", Phys. Rev. B 91, 094517 (2015). https://journals.aps.org/prb/abstract/10.1103/PhysRevB.91.094517.
A. J. Kerman, "Quantum information processing using quasiclassical electromagnetic interactions between qubits and electrical resonators", New J. Phys. 15, 123011 (2013). http://iopscience.iop.org/article/10.1088/1367-2630/15/12/123011/pdf.

* cited by examiner

PERIODICAL MODULATION OF LONGITUDINAL COUPLING STRENGTH FOR QUANTUM NON-DEMOLITION QUBIT READOUT

PRIORITY STATEMENT UNDER 35 U.S.C. § 119 (E) & 37 C.F.R. § 1.78

This non-provisional patent application claims priority based upon the prior U.S. provisional patent application entitled "PARAMETRICALLY MODULATED LONGITUDINAL COUPLING", application No. 62/305,778 filed on 2016 Mar. 9 in the name of "SOCPRA Sciences et Génie s.e.c.", which is incorporated herein in its entirety.

STATEMENT REGARDING FEDERALLY SPONSORED RESEARCH OR DEVELOPMENT

The invention was made under a contract with an agency of the U.S. Government. The name of the U.S. Government agency and Government contract number are: U.S. Army Research Laboratory, Grant W911NF-14-1-0078.

STATEMENT REGARDING PRIOR DISCLOSURES BY THE INVENTOR OR A JOINT INVENTOR

In accordance with 35 U.S.C. § 102(b)(1) and to the Applicant's knowledge, no public disclosure has been made, by the inventor or joint inventor or by another who obtained the subject matter publicly disclosed directly or indirectly from the inventor or a joint inventor, more than one (1) year before the effective filing date of an invention claimed herein.

TECHNICAL FIELD

The present invention relates to quantum computing and, more particularly, to information unit representation and/or manipulation in quantum computing.

BACKGROUND

Quantum computing is presented as the next computational revolution. Yet, before we get there, different problems need to be resolved. For instance, one needs to reliably store information in the form of a quantum bit (qubit), maintain the information reliably in the qubit and read the stored information reliably and repetitively (i.e., non-destructive readout). Another of the challenges of quantum computing is related to logic treatment of more than one qubit without forcing a defined state (i.e., providing one or more logical gates from different qubits in potentially overlapping states).

The present invention addresses at least partly the need for non-destructive readout of a qubit.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A first aspect of the present invention is directed to a circuit quantum electrodynamics (circuit QED) implementation of a quantum information unit (qubit) memory having a qubit frequency $\omega_a$ and holding a value $\hat{\sigma}_z$. The circuit QED implementation comprises a resonator, a modulator and a homodyne detector. The resonator is defined by a resonator damping rate $\kappa$, a resonator frequency $\omega_4$, a resonator electromagnetic field characterized by $\hat{a}^\dagger$ and $\hat{a}$, a longitudinal coupling strength $g_z$, an output $\hat{a}_{out}$ and a quantum non-demolition (QND) longitudinal coupling $g_z\hat{\sigma}_z(\hat{a}^\dagger+\hat{a})$. The modulator periodically modulates the longitudinal coupling strength $g_z$ with a signal of amplitude $\tilde{g}_z$ greater than or equal to the resonator damping rate $\kappa$ and of frequency $\omega_m$ with $\omega_m \pm \kappa$ resonant with $\omega_r \pm$ a correction factor. The correction factor is smaller than $|\omega_r/10|$ and the longitudinal coupling strength $g_z$ varies over time (t) in accordance with $g_z(t)=\bar{g}_z+\tilde{g}_z \cos(\omega_m t)$ with $\bar{g}_z$ representing an average value of $g_z$. The homodyne detector for measuring the value $\hat{\sigma}_z$ of the qubit memory from a reading of the output $\hat{a}_{out}$.

Optionally, the correction factor may be between 0 and $|\omega_r/100|$. The homodyne detector may measure the value $\hat{\sigma}z$ of the qubit memory from a phase reading of the output $\hat{a}_{out}$. The signal amplitude $\tilde{g}_z$ may be at least three (3) times greater than the resonator damping rate $\kappa$ or at least ten (10) times greater than the resonator damping rate $\kappa$.

The circuit QED implementation may optionally further comprise a signal injector providing a single-mode squeezed input on the resonator such that noise on the phase reading from the output $\hat{a}_{out}$ is reduced while noise is left to augment on one or more interrelated characteristics of the output $\hat{a}_{out}$. The average value of $g_z$, $\bar{g}_z$ may be 0 and the single-mode squeezed input may be QND.

The qubit memory may be a transmon comprising two Josephson junctions with substantially equivalent capacitive values and the longitudinal modulator may an inductor-capacitor (LC) oscillator with a phase drop $\delta$ across a coupling inductance placed between the two Josephson junctions. The longitudinal coupling results from mutual inductance between the oscillator and the transmon and the oscillator may vary a flux $\Phi_x$ in the transmon. The transmon may have a flux sweet spot at integer values of a magnetic flux quantum $\Phi_0$, Josephson energy asymmetry of the transmon may be below 0.02 and $\Phi_x$ may vary by $\pm 0.05\Phi_0$ around $\Phi_x=0.9$. A 3-Wave mixing Josephson dipole element may optionally be used to couple the qubit and the resonator. The resonator may further be detuned from the qubit frequency $\omega_a$ by $|\Delta| \geq \tilde{g}_z$. The oscillator inductance may, for instance, be provided by an array of Josephson junctions or by one or more Superconducting Quantum Interference Device (SQUID).

A second aspect of the present invention is directed to a method for reading a value $\hat{\sigma}_z$ stored in a quantum information unit (qubit) memory having a qubit frequency $\omega_a$, with a resonator defined by a resonator damping rate $\kappa$, a resonator frequency $\omega_r$, a resonator electromagnetic field characterized by $\hat{a}^\dagger$ and $\hat{a}$, a longitudinal coupling strength $g_z$, an output $\hat{a}_{out}$ and a quantum non-demolition (QND) longitudinal coupling $g_z\hat{\sigma}_z(\hat{a}^\dagger+\hat{a})$. The method comprises, at a modulator, periodically modulating the longitudinal coupling strength $g_z$ with a signal of amplitude $\tilde{g}_z$ greater than or equal to the resonator damping rate $\kappa$ and of frequency $\omega_m$ with $\omega_m \pm \kappa$ resonant with $\omega_r \pm$ a correction factor. The correction factor is smaller than $|\omega_r/10|$ and the longitudinal coupling strength $g_z$ varies over time (t) in accordance with $g_z(t)=\bar{g}_z+\tilde{g}_z \cos(\omega_m t)$ with $\bar{g}_z$ representing an average value of $g_z$. The method also comprises, at a homodyne detector, measuring the value $\hat{\sigma}_z$ of the qubit memory from a reading of the output $\hat{a}_{out}$.

Optionally, the signal amplitude $\tilde{g}_z$ may be at least three (3) times greater than the resonator damping rate κ or at least ten (10) times greater than the resonator damping rate κ.

The method may further comprise, from a signal injector, providing a single-mode squeezed input on the resonator such that noise on the phase reading from the output $\hat{a}_{out}$ is reduced while noise is left to augment on one or more interrelated characteristics of the output $\hat{a}_{out}$. The average value of $g_z$, $\bar{g}_z$ may be set to 0 and the single-mode squeezed input may be QND.

Optionally, the qubit memory may be a transmon comprising two Josephson junctions with substantially equivalent capacitive values and the longitudinal modulator comprises an inductor-capacitor (LC) oscillator with a phase drop δ across a coupling inductance placed between the two Josephson junctions. The longitudinal coupling results from mutual inductance between the oscillator and the transmon and the oscillator varies a flux $\Phi_x$ in the transmon. The transmon may have a flux sweet spot at integer values of a magnetic flux quantum $\Phi_0$, Josephson energy asymmetry of the transmon may be below 0.02 and $\Phi_x$ may vary by $\pm 0.05\Phi_0$ around $\Phi_x = 0$.

The method may also further comprise detuning the resonator from the qubit frequency $\omega_a$ by $|\Delta| \geq \tilde{g}_z$. Optionally, the oscillator inductance may be provided by an array of Josephson junctions or by one or more Superconducting Quantum Interference Device (SQUID).

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
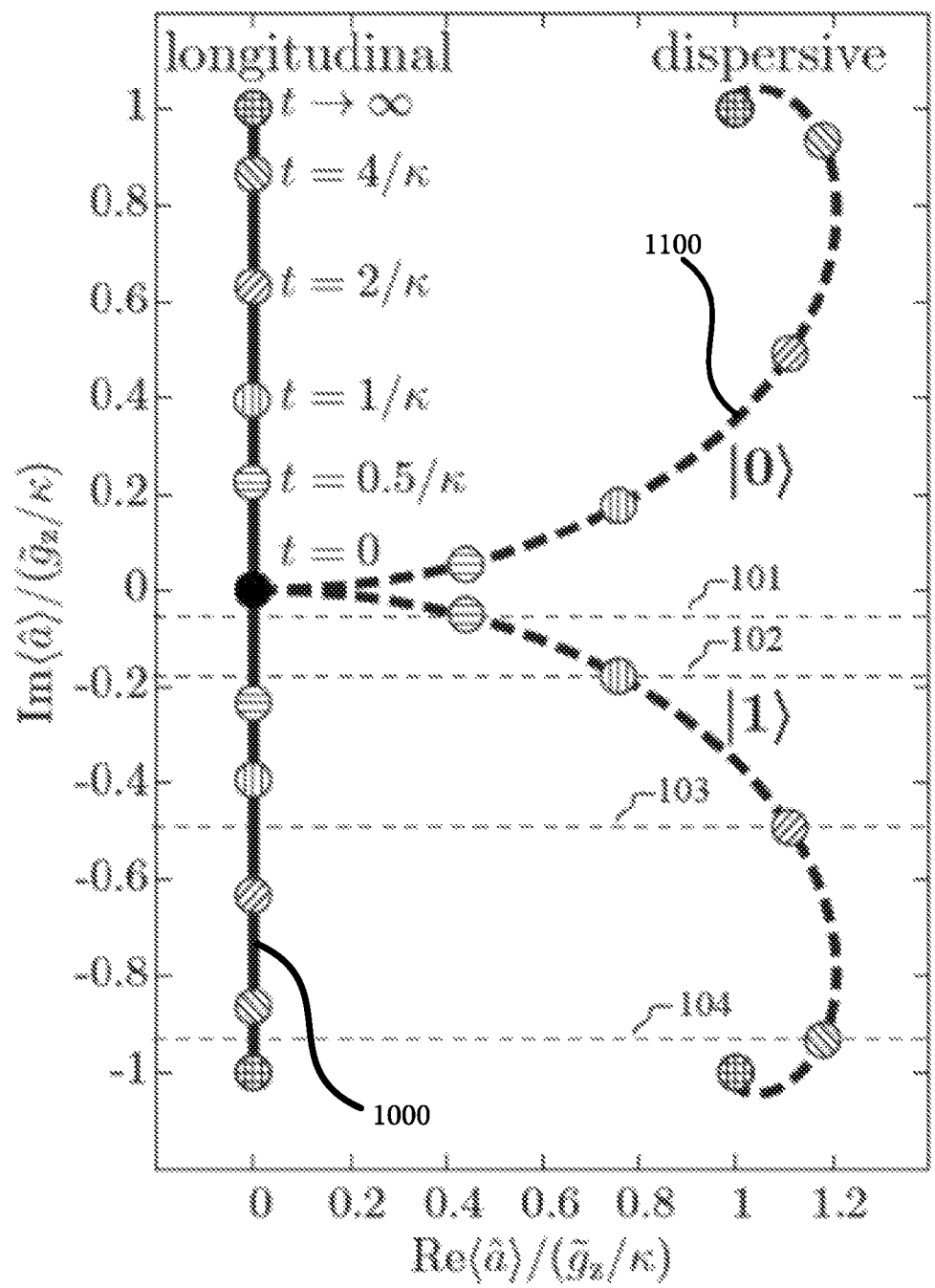
FIG. 1 is schematic representation of pointer state evolution in a phase space from an initial oscillator vacuum state.

The present invention relates to effective quantum non-demolition (QND) qubit readout by modulating longitudinal coupling strength between a qubit and a resonator. The longitudinal coupling strength between a qubit and a resonator may also be referred to as longitudinal qubit-resonator interaction. In one embodiment, the QND qubit readout is accomplished by modulating longitudinal coupling between a resonator and a qubit at the resonator frequency. The resonator may also be presented, from a terminology standpoint, as an oscillator, a cavity or qubit-cavity. The longitudinal coupling strength then provides a qubit-state dependent signal from the resonator. This situation is fundamentally different from the standard dispersive case. Single-mode squeezing can optionally be exploited to increase the signal-to-noise ratio of the qubit readout protocol. An exemplary implementation of the qubit readout is provided in circuit quantum electrodynamics (circuit QED) and a possible multi-qubit architecture is also exemplified. Reference is made to the drawings throughout the following description.

For quantum information processing, qubit readout is expected to be fast, of high-fidelity and ideally QND. In order to rapidly reuse the measured qubit, fast reset of the measurement pointer states is also needed. Combining these characteristics is essential to meet the stringent requirements of fault-tolerant quantum computation. Dispersive readout relies on coupling the qubit to an oscillator acting as pointer. With the qubit modifying the oscillator frequency in a state-dependent fashion, driving the oscillator displaces its initial vacuum state to qubit-state dependent coherent states. Resolving these pointer states by homodyne detection completes the qubit measurement. The dispersive readout approach is used with superconducting qubits and quantum dots, and is studied in a wide range of systems including donor-based spin qubits and Majorana fermions. The same qubit-oscillator interaction is used to measure the oscillator state in cavity QED with Rydberg atoms.

Embodiments of the present invention provide parametric modulation of longitudinal qubit-resonator interaction for a faster, high-fidelity and ideally QND qubit readout with a reset mechanism. Embodiments of the present invention show that the signal-to-noise ratio (SNR) of the qubit readout can be further improved with a single-mode squeezed input state on the resonator. Like dispersive readout, the approach presented herein is applicable to a wide variety of systems. Skilled people will readily recognize that the modulation principle presented herein could be applied outside of the superconductive context.

A quantum information unit (qubit) memory is provided with a qubit frequency $\omega_a$ characterized by $\hat{\sigma}_z$. A resonator is provided that is defined by a resonator damping rate κ, a resonator frequency $\omega_r$, a resonator electromagnetic field characterized by $\hat{a}^\dagger$ and $\hat{a}$, a longitudinal coupling strength $g_z$ and an output $\hat{a}_{out}$.

Conventional dispersive readout of $\hat{\sigma}_z$ relies on transversal qubit-resonator coupling defined with a Hamiltonian $\hat{H}_x = g_x(\hat{a}^\dagger + \hat{a})\hat{\sigma}_x$. Embodiments of the present invention rely on longitudinal coupling (or longitudinal interaction) between the resonator and the qubit memory defined with a Hamiltonian $\hat{H}_z = g_z\hat{\sigma}_z(\hat{a}^\dagger + \hat{a})$. Despite the apparently minimal change, the choice of focusing the qubit readout on longitudinal coupling improves qubit readout. First, longitudinal coupling leads to an efficient separation of the pointer states. Indeed, $\hat{H}_z$ is the generator of displacement of the oscillator field with a qubit-state dependent direction.

Figure 2:
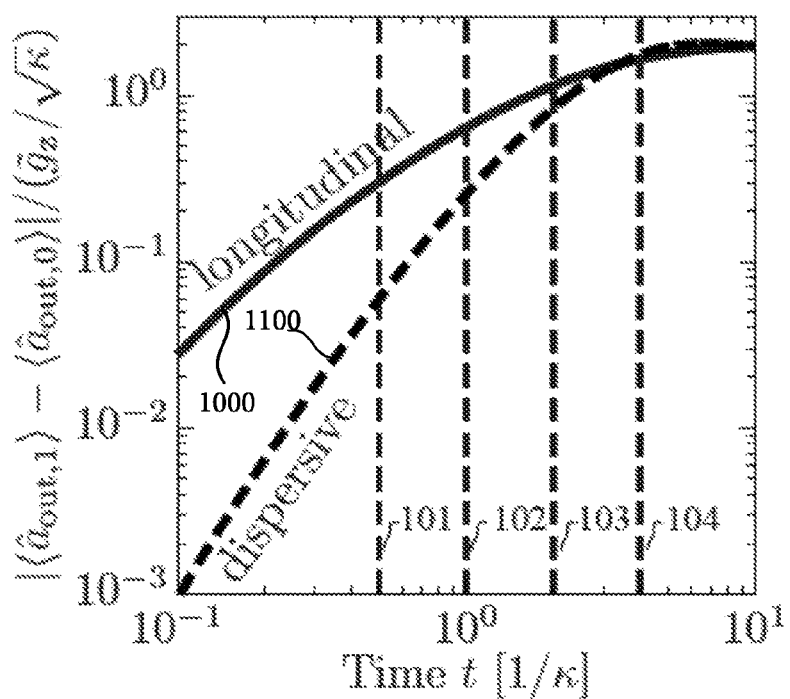
FIG. 2 is graph presenting pointer state separation in a phase space as a function of time.

FIG. 1 of the drawings provides a schematic representation of pointer state evolution of the intra-resonator field $\hat{a}$ in a phase space from an initial resonator vacuum state. FIG. 2 provides a corresponding graph presenting pointer state separation in a phase space as a function of time (t). Full lines 1000 relate to longitudinal modulation readout while dispersive readout for a dispersive shift $$\chi = \frac{\kappa}{2}$$

is illustrated by the dashed lines 1100. Evolution from the initial resonator vacuum state is illustrated in phase space by lines 1000 and 1100 after a certain time (t). Discrete times and steady-state (t→∞) are provided for illustrative purposes with similar times being depicted using similar hatching patterns on lines 1000 and 1100. Circle size around at each time are used to illustrate uncertainty on the corresponding measured value, but are not drawn to scale on FIG. 1. As can be appreciated, dispersive readout illustrated by the dashed lines 1100 on FIG. 1 provides for complex path in phase space and poor separation of the pointer states at short times. For this reason, even for identical steady-state separation of the pointers, longitudinal readout is significantly faster than its dispersive counterpart. On FIG. 2, pointer state separation is depicted for the resonator output field $\hat{a}_{out}$ as a function of time t. Vertical dashed lines (101 to 104) correspond to the same lines in FIG. 1.

The results depicted on FIG. 1 may be obtained using a modulator periodically modulating the longitudinal coupling strength $g_z$ with a signal of amplitude $\tilde{g}_z$ greater than or equal to the resonator damping rate $\kappa$ and of frequency $\omega_m$ with $\omega_m \pm \kappa$ resonant with $\omega_r \pm a$ correction factor. The correction factor is $<\omega_r/10$, and may for instance be between 0 and $\omega_r/100$. In some embodiments, $\tilde{g}_z$ is at least 3 times $\kappa$ or at least 10 times $\kappa$. The longitudinal coupling strength $g_z$ varies over time (t) in accordance with $g_z(t)=\bar{g}_z+\tilde{g}_z \cos(\omega_m t)$ with $\bar{g}_z$ representing an average value of $g_z$. Using a homodyne detector, the value $\hat{\sigma}_z$ of the qubit memory is measured from a phase reading of the output $\hat{a}_{out}$.

Figure 3:
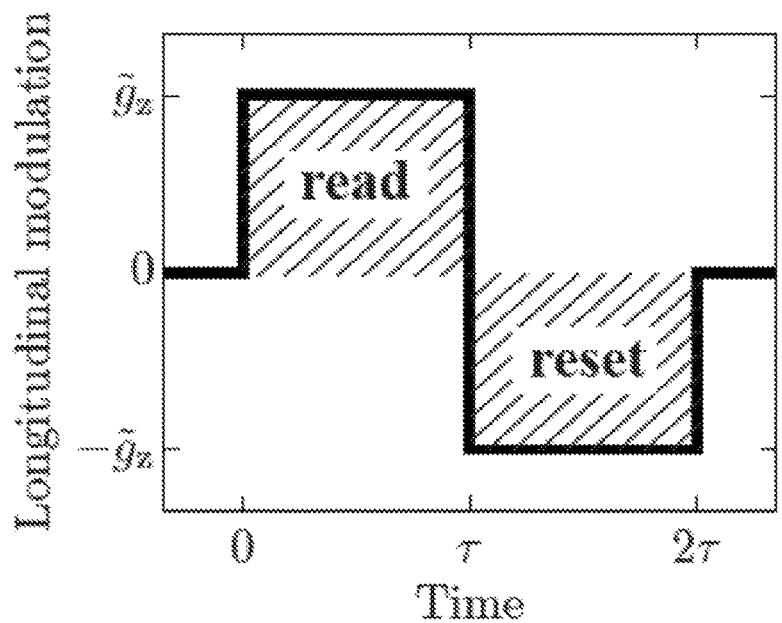
FIG. 3 is a graphical representation of different signal-to-noise ratios versus integration time different couplings.

FIG. 3 shows a logic depiction of an exemplary readout—reset cycle. After a measurement time τ, longitudinal modulation amplitude $\tilde{g}_z$ is reversed (i.e., $-\tilde{g}_z$) during a time τ to move the pointer state to the origin irrespective of the qubit state.

As can be appreciated, larger pointer state separations is achieved using a longitudinal modulator because $\hat{H}_z$ commutes with the value of the qubit $\hat{\sigma}_z$ (also referred to as the measured qubit observable), resulting in an ideally QND readout. The situation is different from the dispersive case because $(\hat{H}_x|\hat{\sigma}_z)\neq 0$. In the dispersive regime, where the qubit-resonator detuning Δ is large with respect to $g_x$, non-QNDness manifests itself with Purcell decay and with the experimentally observed measurement-induced qubit transitions. For these reasons, the resonator damping rate $\kappa$ cannot be made arbitrarily large using and the measurement photon number $\bar{n}$ is typically kept well below the critical photon number $n_{crit}=(\Delta/2g_x)^2$. As a result, dispersive readout is typically slow (small $\kappa$) and limited to poor pointer state separation (small $\bar{n}$).

Under longitudinal coupling, the qubit-resonator Hamiltonian reads ($\hbar/2\pi$) $\hat{H}_z=\omega_r\hat{a}^\dagger\hat{a}+\frac{1}{2}\omega_a\hat{\sigma}_z+g_z\hat{\sigma}_z(\hat{a}^\dagger+\hat{a})$ (referred to as Equation 1 hereinafter).

In steady-state, Equation 1 leads to a qubit-state dependent displacement of the resonator field amplitude $$\pm \frac{g_z}{\omega_r + \frac{i\kappa}{2}}$$

A static longitudinal interaction is therefor of no consequence for the typical case where $\omega_r \gg g_z, \kappa_r$.

It is proposed herein to render the longitudinal interaction resonant during qubit readout by modulating the longitudinal coupling at the resonator frequency: $g_z(t)=\bar{g}_z+\tilde{g}_z \cos(\omega_m t)$. From the perspective of the longitudinal coupling and neglecting fast-oscillating terms, the following Equation 2 is obtained: $\hat{H}_x=\frac{1}{2}\tilde{g}_z\hat{\sigma}_z(\hat{a}^\dagger+\hat{a})$ From Equation 2, it can be appreciated that a large qubit-state dependent displacement $$\pm \frac{\tilde{g}_z}{\kappa}$$

is realized. Even with a conservative modulation amplitude $\tilde{g}_z \sim 10\kappa$, the steady-state displacement corresponds to 100 photons and the two qubit states are easily distinguishable by homodyne detection. With this longitudinal coupling, there is no concept of critical photon number and a large photon population is therefore not expected to perturb the qubit. Moreover, as already illustrated in FIG. 1, the pointer states take an improved path in phase space towards their steady-state separation. As shown in FIG. 2, this leads to a large pointer state separation at short times.

The consequences of using longitudinal coupling for qubit measurement can be quantified with the signal-to-noise ratio (SNR). The SNR quantity is evaluated using $\hat{M}(\tau)=\sqrt{\kappa}\int_0^\tau \partial t[\hat{a}_{out}^\dagger(t)+\hat{a}_{out}(t)]$ the measurement operator for homodyne detection of the output signal $\hat{a}_{out}$ with a measurement time τ. The signal is defined as $|\langle\hat{M}\rangle_1-\langle\hat{M}\rangle_0|$ where {0,1} refers to qubit state, while the imprecision noise is $[\langle\hat{M}_{N1}^2(\tau)\rangle+\langle\hat{M}_{N0}^2(\tau)\rangle]^{1/2}$ with $\hat{M}_N=\hat{M}-\langle\hat{M}\rangle$.

Combining these expressions, the SNR for the longitudinal case reads in accordance with Equation 3:

$$SNR_z = \sqrt{8}\frac{|\tilde{g}_z|}{\kappa}\sqrt{\kappa\tau}\left[1-\frac{2}{\kappa\tau}\left(1-e^{-\frac{1}{2}\kappa\tau}\right)\right]$$

This is to be contrasted to $SNR_\chi$ for dispersive readout with drive amplitude $\epsilon$ and optimal dispersive coupling $\chi=g_x^2/\Delta=\kappa/2$ in accordance with Equation 4:

$$SNR_\chi = \sqrt{8}\frac{|\epsilon|}{\kappa}\sqrt{\kappa\tau}\left[1-\frac{2}{\kappa\tau}\left(1-e^{-\frac{1}{2}\kappa\tau}\cos\frac{1}{2}\kappa\tau\right)\right]$$

Both expressions have a similar structure, making very clear the similar role of $\tilde{g}_z$ and $\epsilon$, except for the cosine in Equation (4) that is a signature of the complex dispersive path in phase space. For short measurement times $\kappa\tau \ll 1$, a favorable scaling is obtained for longitudinal modulation readout with $SNR_z \propto SNR_\chi/\kappa\tau$.

Figure 4:
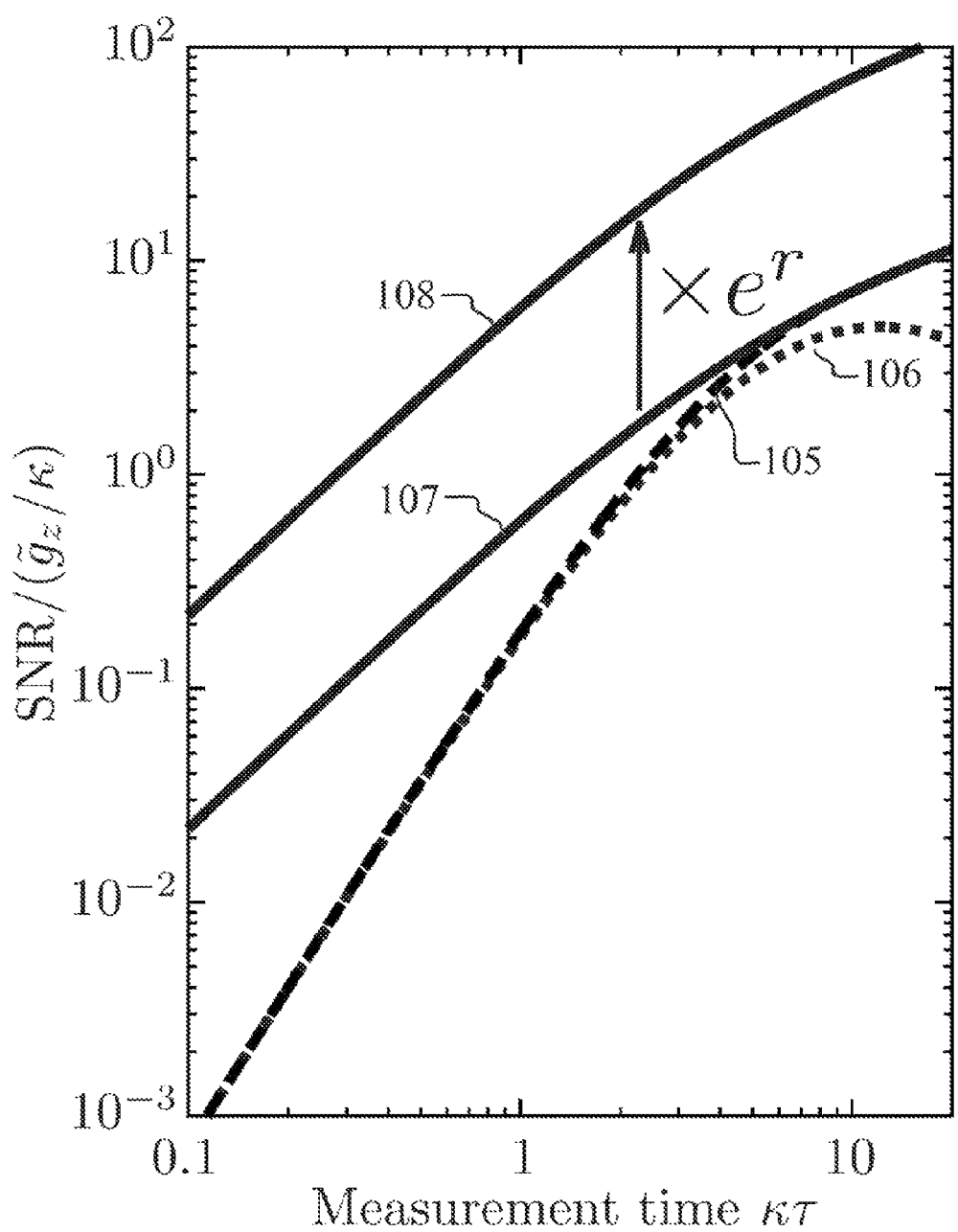
FIG. 4 is a graphical representation of SNR versus integration time for different couplings.

FIG. 4 shows a graphical representation of SNR versus integration time for longitudinal (107) and dispersive without Purcell decay (105) coupling. Even for equal steady-state separation ($\tilde{g}_z=\epsilon$), shorter measurement time are obtained for longitudinal coupling. SNR is shown in units of $\tilde{g}_z/\kappa$ as a function of integration time τ. Longitudinal coupling (107) is compared to dispersive coupling (105) with $\chi=\kappa/2$ for the same steady-state separation, $|\tilde{g}_z|=|\epsilon|$. Line (106) accounts for Purcell decay in dispersive readout. Line (108) shows exponential improvement obtained for when a single-mode squeezed input state with $e^{2r}=100$ (20 dB).

Figure 5:
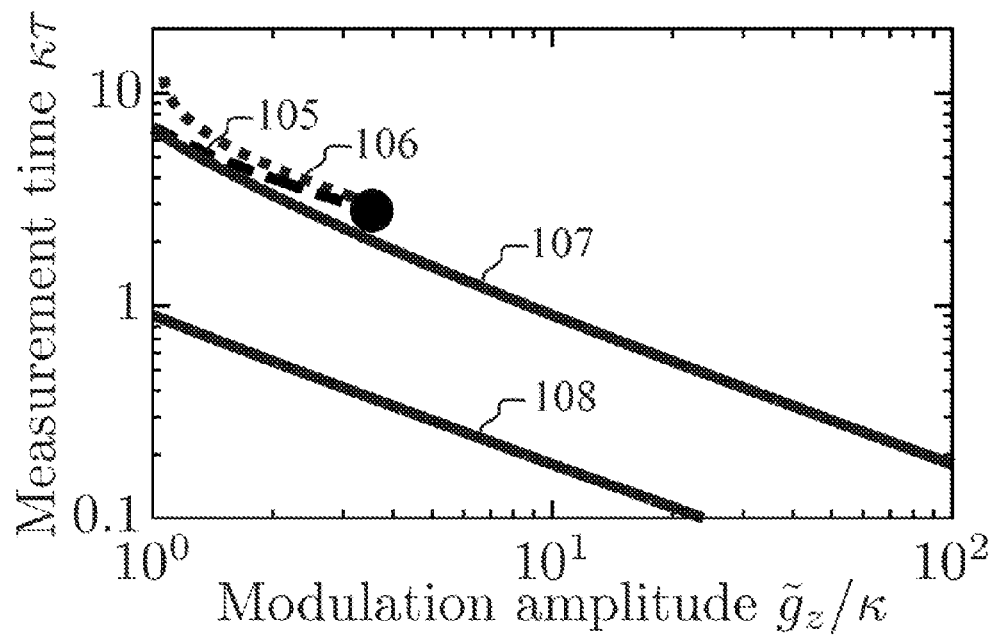
FIG. 5 is a graphical representation of the measurement time τ required to reach a fidelity of 99.99%.
Figure 6:
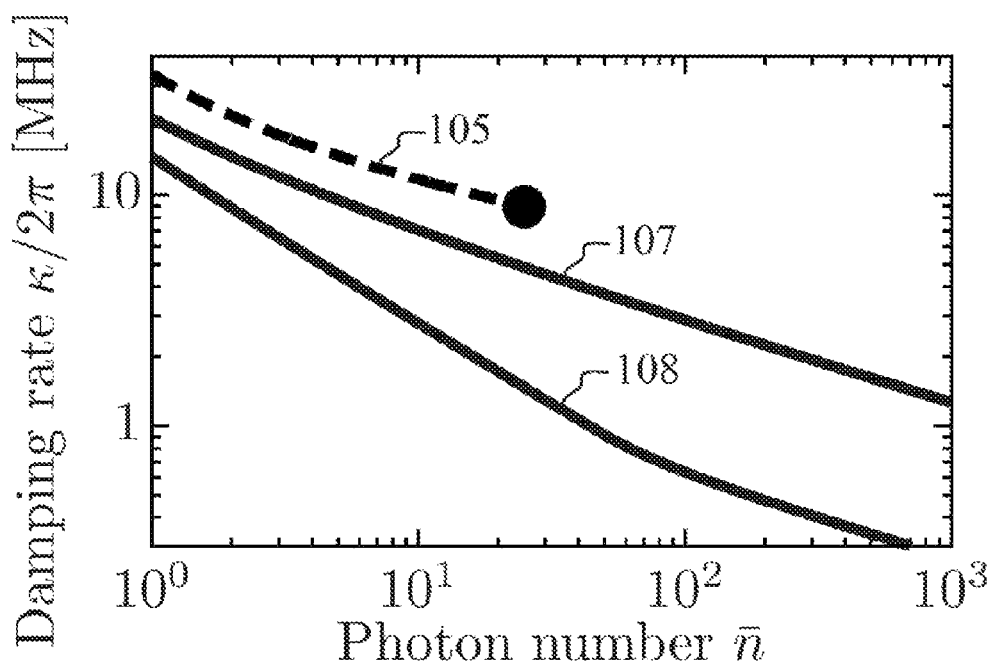
FIG. 6 is a graphical representation of resonator damping rate κ/2π to reach a fidelity of 99.99% in 50 ns.

FIG. 5 provides a graphical representation of the measurement time τ required to reach a fidelity of 99.99% as a function of $\tilde{g}_z/\kappa$ (or $\epsilon/\kappa$ for the dispersive case). When taking into account the non-perturbative effects that affect the QNDness of dispersive readout, the potential of the present approach is made even clearer. Line (106) of FIG. 4 and FIG. 5 correspond to the dispersive case with Purcell decay. In this more realistic case, longitudinal readout outperforms its counterpart at all times. FIG. 6 provides a graphical representation of resonator damping rate $\kappa/2\pi$ to reach a fidelity of 99.99% in τ=50 ns versus intra-resonator photon number $\bar{n}=(\tilde{g}_z/\kappa)^2=(\epsilon/\kappa)^2$. Squeezing (108) helps in further reducing the required photon number or resonator damping rate. The squeeze strength is optimized for each κ, with a maximum set to 20 dB reached close to $\kappa/2\pi=1$ MHz In FIGS. 5 and 6, results for the dispersive readout are stopped at the critical photon number obtained for a drive strength $\epsilon_{crit}=\Delta/\sqrt{8}g_x$ for $g_x/\Delta=1/10$.

Up to this point, equal pointer state separation has been assumed for the longitudinal and the dispersive readouts. As already mentioned, dispersive readout is, however, limited to measurement photon numbers well below $n_{crit}$. This is taken into account in FIGS. 5 and 6 by stopping the dispersive curves at $n_{crit}$ (black circle) assuming the typical value $g_x/\Delta=1/10$. FIG. 5 illustrates that only longitudinal readout allows for measurement times <1/κ. This is moreover achieved for reasonable modulation amplitudes with respect to the cavity linewidth As illustrated, the longitudinal coupling strength $g_z$ with having a signal of amplitude $\tilde{g}_z$ at least three (3) times greater than the resonator damping rate κ still allows for qubit readout. On FIG. 6, the resonator damping rate vs photon number required to reach a fidelity of 99.99% in τ=50 ns is illustrated. Note that line (106) corresponding to dispersive with Purcell is absent from this plot. With dispersive readout, it appears impossible to achieve the above target fidelity and measurement time in the very wide range of parameters of FIG. 6. On the other hand, longitudinal readout with quite moderate values of κ and $\bar{n}$ provide meaningful results. Further speedups are expected with pulse shaping and machine learning. Because the pointer state separation is significantly improved even at short time, the latter approach should be particularly efficient.

To allow for rapid reuse of the qubit, the resonator should be returned to its grounds state ideally in a time <<1/κ after readout. A pulse sequence achieving this for dispersive readout has been proposed but is imperfect because of qubit-induced nonlinearity deriving from $\hat{H}_x$.

As illustrated in FIG. 3, with an approach based on longitudinal modulation as proposed herein, resonator reset is realized by inverting the phase of the modulation. Since $\hat{H}_z$ does not lead to qubit-induced nonlinearity, the reset remains ideal. In practice, reset can also be shorter than the integration time. It is also interesting to point out that longitudinal modulation readout saturates the inequality $\Gamma_{\phi m} \geq \Gamma_{meas}$ linking the measurement-induced dephasing rate $\Gamma_{\phi m}$ to the measurement rate $\Gamma_{meas}$ and is therefore quantum limited.

Another optional feature of the longitudinal modulation readout to improve SNR (theoretically exponentially) by providing a single-mode squeezed input state on the resonator. The squeeze axis is chosen to be orthogonal to the qubit-state dependent displacement generated by $g_z(t)$. referring back to the example of FIG. 1, squeezing would provide for a more defined value along the vertical axis. Since the squeeze angle is unchanged under evolution with $\hat{H}_z$, the imprecision noise is exponentially reduced along the vertical axis while the imprecision noise is left to augment along the horizontal axis. The signal-to-noise ratio becomes $e^r SNR_z$, with r the squeeze parameter. This exponential enhancement is apparent from line (108) depicted in FIG. 4 and in the corresponding reduction of the measurement time in FIG. 5. Note that by taking $\tilde{g}_z=0$, the resonator field can be squeezed prior to measurement without negatively affecting the qubit.

The exponential improvement is in contrast to standard dispersive readout where single-mode squeezing can lead to an increase of the measurement time. Indeed, under dispersive coupling, the squeeze angle undergoes a qubit-state dependent rotation. As a result, both the squeezed and the anti-squeezed quadrature contributes to the imprecision noise. It is to be noted that the situation can be different in the presence of two-mode squeezing where an exponential increase in SNR can be recovered by engineering the dispersive coupling of the qubit to two cavities.

Figure 7:
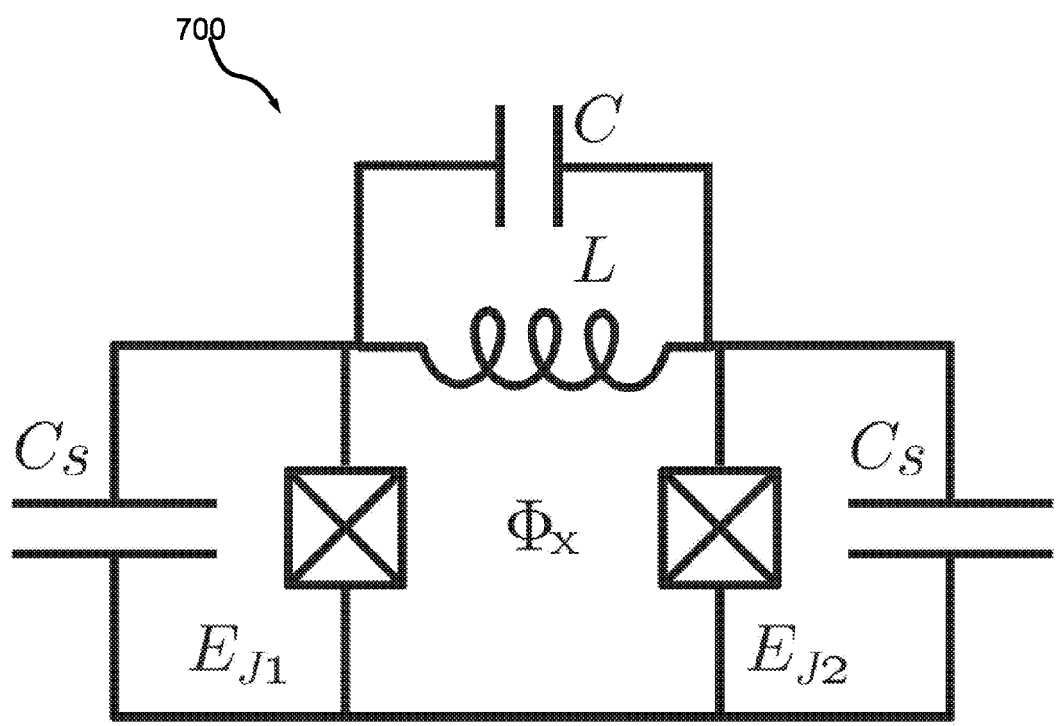
FIG. 7 is a logical representation of a circuit QED implementation of the longitudinal coupling modulation.

While the longitudinal modulation approach is very general, a circuit QED implementation 700 is discussed in greater details hereinafter with reference to FIG. 7. Longitudinal coupling of a flux or transmon qubit to a resonator of the LC oscillator type may result from the mutual inductance between a flux-tunable qubit and the resonator. Another example focuses on a transmon qubit phase-biased by the oscillator. FIG. 7 shows a schematically lumped version of an exemplary circuit QED implementation 700 considering the teachings of the present disclosure. In practice, the inductor L can be replaced by a Josephson junction array, both to increase the coupling and to reduce the qubit's flux-biased loop size. Alternatives (e.g., based on a transmission-line resonator) may also be realized as it is explored with respect to other embodiments described hereinbelow.

The Hamiltonian of the circuit of FIG. 7 is similar to that of a flux-tunable transmon, but where the external flux $\Phi_x$ is replaced by $\Phi_x+\delta$ with δ the phase drop at the oscillator. Taking the junction capacitances $C_s$ to be equal and assuming for simplicity that $Z_0/R_K<<1$, with $Z_0=\sqrt{L/C}$ and $R_K$ the resistance quantum, the Hamiltonian of the circuit QED 700 may be expressed as $\hat{H}=\hat{H}_r+\hat{H}_q+\hat{H}_{qr}$, with $\hat{H}_r=\omega_r\hat{a}^\dagger\hat{a}$ presenting the oscillator Hamiltonian and $\hat{H}_q=1/2\omega_a\hat{\sigma}_z$ presenting the Hamiltonian of a flux transmon written here in its two-level approximation.

The Hamiltonian of the qubit-oscillator interaction (or longitudinal coupling strength) takes the form $\hat{H}_{qr}=g_x\hat{\sigma}_z(\hat{a}^\dagger+\hat{a})+g_z\hat{\sigma}_z(\hat{a}^\dagger+\hat{a})$ when Equation 5 and Equation 6 are satisfied:

$$g_z = -\frac{E_J}{2}\left(\frac{2E_C}{E_J}\right)^{1/2}\sqrt{\frac{\pi Z_0}{R_K}}\sin\left(\frac{\pi\Phi_x}{\Phi_0}\right)$$

$$g_x = dE_J\left(\frac{2E_C}{E_J}\right)^{1/4}\sqrt{\frac{\pi Z_0}{R_K}}\cos\left(\frac{\pi\Phi_x}{\Phi_0}\right)$$

where $E_J$ is the mean Josephson energy, d the Josephson energy asymmetry and $E_C$ the qubit's charging energy. Skilled person will readily be able to locate expressions for these quantities in terms of the elementary circuit parameters. In the circuit QED implementation 700, $E_{J1}=E_J(1+d)/2$ and $E_{J2}=E_J(1-d)/2$ with d∈[0,1]. As purposely pursued, the transverse coupling $g_x$ vanishes exactly for d=0, leaving only longitudinal coupling $g_z$. Because longitudinal coupling is related to the phase bias rather than inductive coupling, $g_z$ can be made large.

Figure 9:
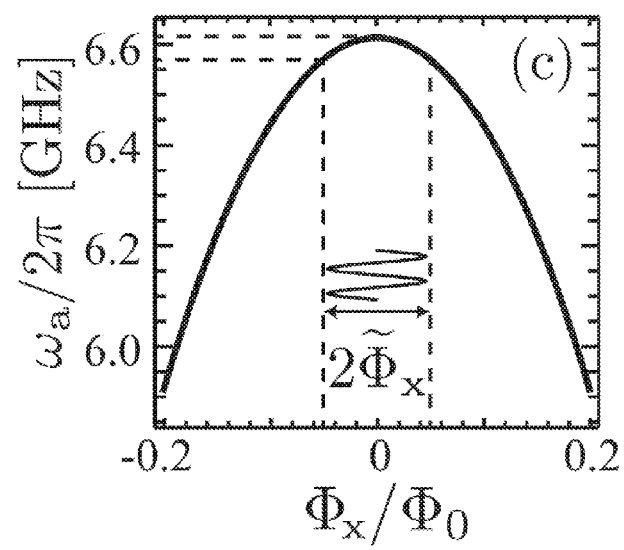
FIG. 9 is a graphical representation of transmon frequency versus flux.
Figure 8:
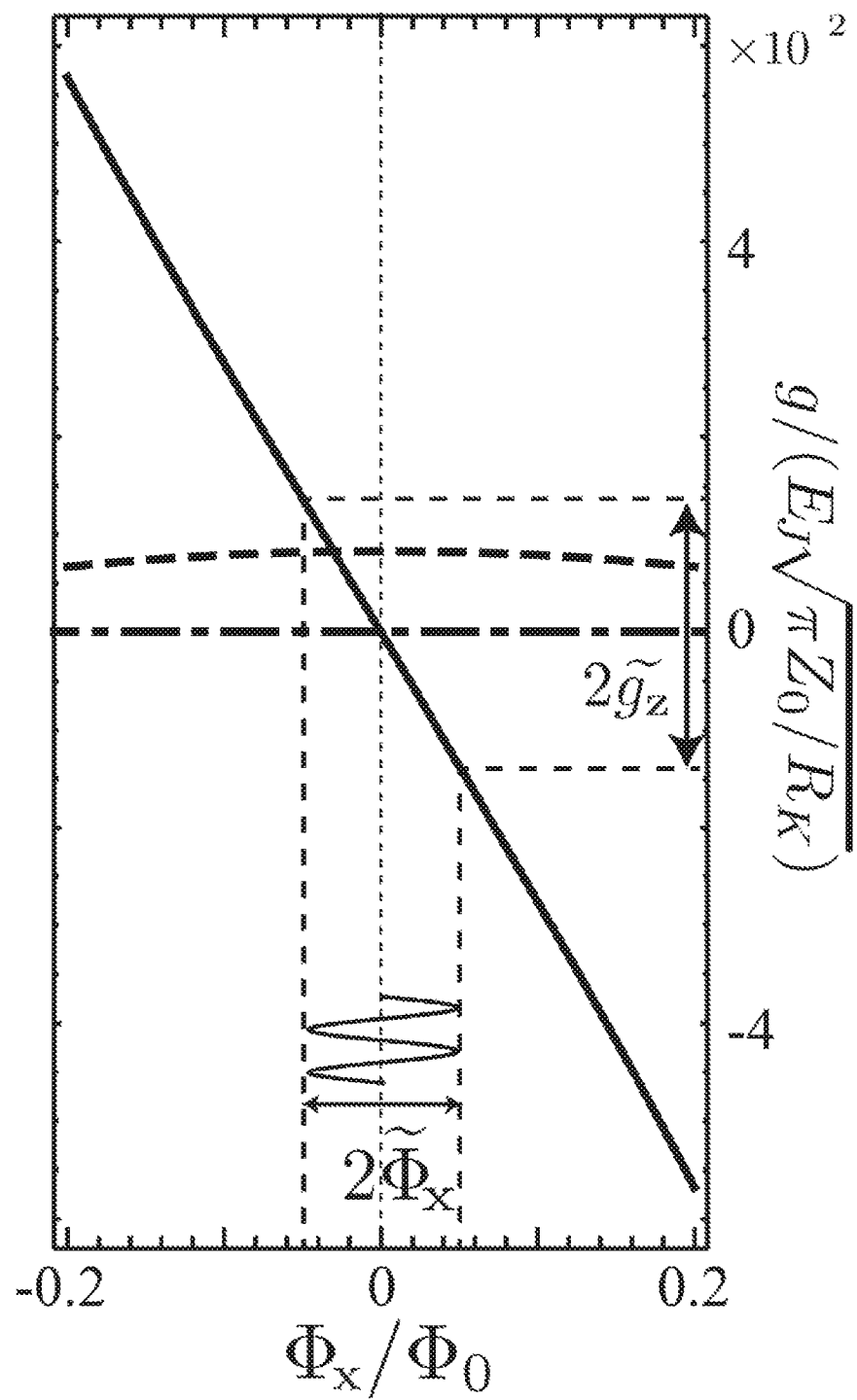
FIG. 8 is a graphical representation of flux $\Phi_x/\Phi_0$ dependence of both $g_z$ and $g_x$.

For example, with the realistic values $E_J/h=20$ GHz, $E_J/E_C=67$ and $Z_0=50\Omega$, $g_z/2\pi \approx 135$ MHz×$\sin(\pi\Phi_x/\Phi_0)$ where $\Phi_0$ represents the magnetic flux quantum. FIG. 8 shows a graphical representation of flux $\Phi_x/\Phi_0$ dependence of both $g_z$ (full line) and $g_x$ with d=0 (dash-dotted line) and d=0.02 (dashed line). Modulating the flux by $0.05\Phi_0$ around $\Phi_x=0$, it follows that $\bar{g}_z=0$ and $\tilde{g}_z/2\pi\sim21$ MHz Conversely, only a small change of the qubit frequency of ~40 MHz is affected, as can be appreciated from FIG. 9 showing transmon frequency versus flux in accordance with the preceding exemplary parameters. Importantly, this does not affect the SNR.

As can be appreciated, a finite $g_x$ for d≠0. On FIG. 8, a realistic value of d=0.02 and the above parameters, $g_x/2\pi\approx13$ MHz×$\cos(\pi\Phi_x/\Phi_0)$. The effect of this unwanted coupling can be mitigated by working at large qubit-resonator detuning $\Delta$ where the resulting dispersive interaction $\chi=g_x^2/2\Delta$ can be made very small. For example, the above numbers correspond to a detuning of $\Delta/2\pi=3$ GHz where $\chi/2\pi\sim5.6$ kHz. It is important to emphasize that, contrary to dispersive readout, the longitudinal modulation approach is not negatively affected by a large detuning.

When considering higher-order terms in $Z_0/R_K$, the Hamiltonian of the circuit QED 700 exemplified in FIG. 7 contains a dispersive-like interaction $\chi_z\hat{a}^\dagger\hat{a}\hat{\sigma}_z$ even at d=0. For the parameters already used above, $\chi_z/2\pi\sim5.3$ MHz, a value that is not made smaller by detuning the qubit from the resonator. However since it is not derived from a transverse coupling, $\chi_z$ is not linked to any Purcell decay. Moreover, it does not affect $SNR_z$ at small measurement times.

In the absence of measurement, $\bar{g}_z=\hat{g}_z=0$ and the qubit may advantageously be parked at its flux sweet spot (e.g., integer values of $\Phi_0$). Dephasing due to photon shot noise or to low-frequency flux noise is therefore expected to be minimal. Because of the longitudinal coupling, another potential source of dephasing is flux noise at the resonator frequency which will mimic qubit measurement. However, given that the spectral density of flux noise is proportional to 1/f even at high frequency, this contribution is negligible.

In the circuit QED implementation, the longitudinal readout can also be realized with a coherent voltage drive of amplitude $\epsilon(t)$ applied directly on the resonator, in place of a flux modulation on the qubit. Taking into account higher-order terms in the qubit-resonator interaction, the full circuit Hamiltonian without flux modulation can be approximated to
($g_z$=0)

$$\hat{H}=\omega_r\hat{a}^\dagger\hat{a}+\tfrac{1}{2}\omega_a\hat{\sigma}_z+\chi_z\hat{a}^\dagger\hat{a}\hat{\sigma}_z+i\epsilon(t)(\hat{a}^\dagger-\hat{a})$$

the well-known driven dispersive Hamiltonian where the AC-Stark shift interaction originating from the higher-order longitudinal interaction is given by $$\chi_z = -\frac{\sqrt{E_J E_C}}{\hbar}\frac{\pi Z_r}{R_K}$$

Assuming a drive resonant with the resonator frequency $\omega_r$ with phase $\phi=0$ for simplicity, in the rotating frame the system Hamiltonian becomes (neglecting fast-rotating terms)

$$\hat{H}=\chi_z\hat{a}^\dagger\hat{a}\hat{\sigma}_z + i\frac{\epsilon}{2}(\hat{a}^\dagger-\hat{a})$$

Under a displacement transformation $D(\alpha)\hat{a}D^\dagger(\alpha)=\hat{a}-\alpha$ and including the resonator dissipation, the following is obtained:

$$\hat{H}=\chi_z(\hat{a}^\dagger-\alpha^*)(\hat{a}-\alpha)\hat{\sigma}_z + i\frac{\epsilon}{2}(\hat{a}^\dagger-\hat{a}) + i\frac{\kappa}{2}(\alpha\hat{a}^\dagger-\alpha^*\hat{a})$$

Finally, choosing $\alpha=\epsilon/\kappa$, the system is now simplified to $$\hat{H}=\chi_z\hat{a}^\dagger\hat{a}\hat{\sigma}_z+g'_z(\hat{a}^\dagger+\hat{a})\hat{\sigma}_z$$

with an effective (driven) longitudinal interaction with strength $g'_z=\chi_z\epsilon/\kappa$. In a regime of large voltage drive amplitudes with $\epsilon/\kappa\gg1$, the voltage drive performs the ideal longitudinal readout as the residual dispersive effects are mitigated $g'_z\gg\chi_z$. As mentioned earlier, the absence of Purcell decay and of any critical number of photons in the system allows to push the standard dispersive readout mechanism towards the ideal limit of the longitudinal readout.

A possible multi-qubit architecture consists of qubits longitudinally coupled to a readout resonator (of annihilation operator $\hat{a}_z$) and transversally coupled to a high-Q bus resonator ($\hat{a}_x$). The Hamiltonian describing this system is provided by Equation 7:

$$\hat{H}=\omega_{rz}\hat{a}_z^\dagger\hat{a}_z+\omega_{rx}\hat{a}_x^\dagger\hat{a}_x+\sum_j\frac{1}{2}\omega_{aj}\hat{\sigma}_{zj}+\sum_j g_{zj}\hat{\sigma}_{zj}(\hat{a}_z^\dagger+\hat{a}_z)+\sum_j g_{xj}\hat{\sigma}_{xj}(\hat{a}_x^\dagger+\hat{a}_x)$$

Readout can be realized using longitudinal coupling while logical operations via the bus resonator. Alternative architectures, e.g., taking advantage of longitudinal coupling may also be proposed. Here for instance, taking $g_{zj}(t)=\bar{g}_z+\tilde{g}_z\cos(\omega_r t+\varphi_j)$, the longitudinal coupling, from the perspective of the longitudinal interaction and neglecting fast-oscillating terms, is represented by Equation 8: $\hat{H}_Z=\tfrac{1}{2}\tilde{g}_z\Sigma_j\hat{\sigma}_{zj}e^{-i\varphi_j})\hat{a}_z+H\cdot c$.

This effective resonator drive displaces the field to multi-qubit-state dependent coherent states. For two qubits and taking $\varphi_j=j\pi/2$ leads to the four pointer states separated by 90° from each other or, in other words, to an optimal separation even at short times. Other choices of phase lead to overlapping pointer states corresponding to different multi-qubit states. Examples are $\varphi_j=0$ for which |01> and |10> are indistinguishable, and $\varphi_j=j\pi$ where |00> and ||11> are indistinguishable. However, these properties may be exploited to create entanglement by measurement. As another example, with 3 qubits the GHZ state may be obtained with $\varphi_j=j2\pi/3$.

In the following pages, additional sets of embodiments are presented. In a first additional set of exemplary embodiments, longitudinal coupling is considered (A). In a second additional set of exemplary embodiments, longitudinal coupling with single-mode squeezed states is presented (B). Standard dispersive coupling (C) as well as innovative longitudinal coupling in presence of transverse coupling in the dispersive regime (D) are also considered.

A. Longitudinal Coupling

1 Modulation at the Resonator Frequency

The first set of embodiments (A) considers a qubit longitudinally coupled to a resonator with the Hamiltonian:

$$\hat{H}=\omega_r\hat{a}^\dagger\hat{a}+\tfrac{1}{2}\omega_a\hat{\sigma}_z+[g_z(t)\hat{a}^\dagger+g_z^*(t)\hat{a}]\hat{\sigma}_z. \quad (S1)$$

In this expression, $\omega_r$ is the resonator frequency, $\omega_a$ the qubit frequency and $g_z$ is the longitudinal coupling that is modulated at the resonator frequency:

$$g_z(t) = \bar{g}_z + |\tilde{g}_z| \cos(\omega_r t + \varphi) \tag{S2}$$

In the interaction picture and using the Rotating-Wave Approximation (RWA), the above Hamiltonian simplifies to $$\hat{H} = \tfrac{1}{2}[\tilde{g}_z \hat{a}^\dagger + \tilde{g}_z^* \hat{a}]\hat{\sigma}_z, \tag{S3}$$

where $\tilde{g}_z \equiv |g_z|e^{i\varphi}$ is the modulation amplitude. From Equation (S3), it is clear that the modulated longitudinal coupling plays the role of a qubit-state dependent drive. The Langevin equation of the cavity field simply reads $$\dot{\hat{a}} = -i\tfrac{1}{2}\tilde{g}_z \hat{\sigma}_z - \tfrac{1}{2}\kappa a = \sqrt{\kappa}\hat{a}_{in}, \tag{S4}$$

where $\hat{a}_{in}$ is the input field. Taking this input to be the vacuum, the input correlations are then defined by:

Using the input-output boundary $\hat{a}_{out} = \hat{a}_{in} + \sqrt{\kappa}\hat{a}$, integration of the Langevin equation leads to $$\langle \hat{a}_{in}(t)\hat{a}_{in}^\dagger(t')\rangle = [\hat{a}_{in}(t), \hat{a}_{in}^\dagger(t')] = \delta(t-t') \tag{S5}$$

$$\alpha_{out}(t) = -\frac{i\tilde{g}_z}{\sqrt{\kappa}}\langle\hat{\sigma}_z\rangle\left[1 - e^{-\tfrac{1}{2}\kappa t}\right],$$

$$\hat{d}_{out}(t) = \hat{a}_{in}(t) - \kappa \int_{-\infty}^{t} dt' e^{-\tfrac{1}{2}\kappa(t-t')}\hat{a}_{in}(t'),$$

where $\alpha_{out} = \langle \hat{a}_{out}\rangle$ stands for the output field mean value and $\hat{d}_{out} = \hat{a}_{out} - \alpha_{out}$ its fluctuations. Because here the qubit-dependent drive comes from modulations of the coupling, and not from an external coherent drive, there is no interference between the outgoing and the input fields. As a result, $\alpha = \alpha_{out}/\sqrt{\kappa}$ and the intracavity photon number evolves as $$\langle \hat{a}^\dagger \hat{a}\rangle = \frac{|\tilde{g}_z|^2}{\kappa^2}\left[1 - e^{-\tfrac{1}{2}\kappa t}\right]^2. \tag{S6}$$

The measurement operator corresponding to homodyne detection of the output signal with an integration time $\tau$ and homodyne angle $\phi_h$ is $$\hat{M}(\tau) = \sqrt{\kappa}\int_0^\tau dt[\hat{a}_{out}^\dagger(t)e^{i\phi_h} + \hat{a}_{out}(t)e^{-i\phi_h}]. \tag{S7}$$

The signal for such a measurement is $\langle M \rangle$ while the noise operator is $\hat{M}_N = \hat{M} - \langle \hat{M}\rangle$. In the presence of a qubit, the measurement signal is then $$\langle \hat{M}\rangle_1 - \langle \hat{M}\rangle_0 = 4|\tilde{g}_z|\sin(\varphi - \phi_h)\tau\left[1 - \frac{2}{\kappa\tau}\left(1 - e^{-\tfrac{1}{2}\kappa\tau}\right)\right]. \tag{S8}$$

On the other hand, the measurement noise is equal to $\langle \hat{M}_N^2(\tau)\rangle = \kappa\tau$. Combining these two expressions, the signal-to-noise ratio (SNR) then reads $$SNR^2 \equiv \frac{|\langle \hat{M}\rangle_1 - \langle \hat{M}\rangle_0|^2}{\langle \hat{M}_{N1}^2(\tau)\rangle + \langle \hat{M}_{N0}^2(\tau)\rangle} \tag{S9}$$

$$= \frac{8|\tilde{g}_z|^2}{\kappa^2}\sin^2(\varphi - \phi_h)\kappa\tau\left[1 - \frac{2}{\kappa\tau}\left(1 - e^{-\tfrac{1}{2}\kappa\tau}\right)\right]^2. \tag{S10}$$

The SNR is optimized by choosing the modulation phase $\varphi$ and the homodyne angle such that $\varphi - \phi_h = \mathrm{mod}\,\pi$. With this choice, the optimized SNR finally reads:

$$SNR = \sqrt{8}\,\frac{|\tilde{g}_z|}{\kappa}\sqrt{\kappa\tau}\left[1 - \frac{2}{\kappa\tau}\left(1 - e^{-\tfrac{1}{2}\kappa\tau}\right)\right]. \tag{S11}$$

At long measurement times ($\tau \gg 1/\kappa$), the signal-to-noise ratio evolves as $$SNR = \sqrt{8}\,\frac{|\tilde{g}_z|}{\kappa}\sqrt{\kappa\tau}$$

while in the more experimentally interesting case of short measurement times leads to $$SNR = \frac{1}{\sqrt{2}}\,\frac{|\tilde{g}_z|}{\kappa}(\kappa\tau)^{3/2}.$$

In short, the SNR increases as $\tau^{3/2}$, much faster than in the dispersive regime where the SNR rather increases as $\tau^{5/2}$, as will become apparent in (C) below.

2. Measurement and Dephasing Rates

To evaluate the measurement-induced dephasing rate, a polaron-type transformation is applied on Hamiltonian from (S3) consisting of a displacement of $\hat{a}$ by $-i\tilde{g}_z\hat{\sigma}_z/\kappa$. Under this transformation, the cavity decay Lindbladian $\kappa\mathcal{D}[\hat{a}]\hat{\rho} = \mathcal{D}[\hat{a}]\rho = \hat{a}\rho\hat{a}^\dagger - \tfrac{1}{2}\{\hat{a}^\dagger\hat{a},\rho\}$, leads to $\tfrac{1}{2}\Gamma_{\varphi m}\mathcal{D}[\hat{\sigma}_z]\hat{\rho}$ where $\Gamma_{\varphi m} = 2|\tilde{g}_z|^2/\kappa$ is the measurement-induced dephasing. On the other hand, the measurement rate is obtained from the SNR as $\Gamma_{meas} = SNR^2/(4\tau) = 2|\tilde{g}_z|^2/\kappa$. The relation between the dephasing and the measurement rate is then $\Gamma_{meas} = \Gamma_{\varphi m}$. This is the bound reached for a quantum limited measurement.

3 Modulation Bandwidth

A situation where the longitudinal coupling is modulated at a frequency $\omega_m \neq \omega_r$ is now considered. That is, $g_z(t) = \bar{g}_z + |\tilde{g}_z|\cos(\omega_m t + \varphi)$. Assuming that the detuning $\Delta m = \omega_m - \omega_r$ is small with respect to the modulation amplitude $\tilde{g}_z$, the Hamiltonian in a frame rotating at the modulation frequency now reads under the RWA as:

$$\hat{H} = -\Delta_m \hat{a}^\dagger \hat{a} + \tfrac{1}{2}[\tilde{g}_z \hat{a}^\dagger + \tilde{g}_z^* \hat{a}]\hat{\sigma}_z, \tag{S12}$$

The corresponding Langevin equation is then $$\dot{\hat{a}} = -i\tfrac{1}{2}\tilde{g}_z\hat{\sigma}_z + i\Delta_m \hat{a} - \tfrac{1}{2}\kappa a - \sqrt{\kappa}\hat{a}_{in}, \tag{S13}$$

yielding for the output field, $$\alpha_{out}(t) = -\frac{i\tilde{g}_z\sqrt{\kappa}}{\kappa - 2i\Delta_m}\langle\hat{\sigma}_z\rangle\left[1 - e^{(i\Delta_m - \tfrac{1}{2}\kappa)t}\right], \tag{S14}$$

$$\hat{d}_{out}(t) = \hat{a}_{in}(t) - \kappa \int_{-\infty}^{t} dt' e^{(i\Delta_m - \tfrac{1}{2}\kappa)(t-t')}\hat{a}_{in}(t').$$

From these expressions, the measurement signal is then $$\langle \hat{M}\rangle_1 - \langle \hat{M}\rangle_0 = \frac{4|\tilde{g}_z|}{\sqrt{1 + \left(\frac{2\Delta_m}{\kappa}\right)^2}}\sin[\varphi - \phi_h + \arctan(2\Delta_m/\kappa)]\tau - \tag{S15}$$

$$\frac{8|\tilde{g}_z|/\kappa}{1 + \left(\frac{2\Delta_m}{\kappa}\right)^2}\sin[\varphi - \phi_h + 2\arctan(2\Delta_m/\kappa)] +$$

-continued $$\frac{8|\tilde{g}_z|/\kappa}{1+\left(\frac{2\Delta_m}{\kappa}\right)^2}\sin[\varphi-\phi_h+2\arctan(2\Delta_m/\kappa)+\Delta_m\tau]e^{-\frac{1}{2}\kappa\tau}.$$

While the signal is changed, the noise is however not modified by the detuning. From the above expression, given a detuning $\Delta m$ and a measurement time T, there is an optimal angle $\varphi$ that maximizes the SNR.

B. Longitudinal Coupling with Squeezing

In the second set of exemplary embodiments (B), a situation where the modulation detuning is zero and where the input field is in a single-mode squeezed vacuum is now considered. This leaves the signal unchanged, but as will be appreciated, leads to an exponential increase of the SNR with the squeeze parameter r. Indeed, in the frame of the resonator, the correlations of the bath fluctuations are now $$\begin{pmatrix} \langle \hat{d}_{in}^\dagger(t)\hat{d}_{in}(t')\rangle & \langle \hat{d}_{in}(t)\hat{d}_{in}(t')\rangle \\ \langle \hat{d}_{in}^\dagger(t)\hat{d}_{in}^\dagger(t')\rangle & \langle \hat{d}_{in}(t)\hat{d}_{in}^\dagger(t')\rangle \end{pmatrix} = \begin{pmatrix} \sinh_r^2 & \frac{1}{2}\sinh 2re^{2i\theta} \\ \frac{1}{2}\sinh 2re^{-2i\theta} & \cosh^2 r \end{pmatrix}\delta(t-t'). \quad (S16)$$

where is has been assumed broadband squeezing with a squeeze angle θ. The measurement noise is then $$\langle \hat{M}_N^2(\tau)\rangle = \kappa\int_0^\tau dt\int_0^\tau dt'[\langle \hat{d}_{out}^\dagger(t)\hat{d}_{out}(t')\rangle + \langle \hat{d}_{out}(t)\hat{d}_{out}^\dagger(t')\rangle + \langle \hat{d}_{out}(t)\hat{d}_{out}(t')\rangle e^{-2i\phi_h} + \langle \hat{d}_{out}^\dagger(t)\hat{d}_{out}^\dagger(t')\rangle e^{2i\phi_h}]. \quad (S17)$$

The output-field correlations are easily obtained from $$\begin{pmatrix} \langle \hat{d}_{out}^\dagger(t)\hat{d}_{out}(t')\rangle & \langle \hat{d}_{out}(t)\hat{d}_{out}(t')\rangle \\ \langle \hat{d}_{out}^\dagger(t)\hat{d}_{out}^\dagger(t')\rangle & \langle \hat{d}_{out}(t)\hat{d}_{out}^\dagger(t')\rangle \end{pmatrix} = \quad (S18)$$

$$\begin{pmatrix} \langle \hat{d}_{in}^\dagger(t)\hat{d}_{in}(t')\rangle & \langle \hat{d}_{in}(t)\hat{d}_{in}(t')\rangle \\ \langle \hat{d}_{in}^\dagger(t)\hat{d}_{in}^\dagger(t')\rangle & \langle \hat{d}_{in}(t)\hat{d}_{in}^\dagger(t')\rangle \end{pmatrix}$$

which holds here since the drive is 'internal' to the cavity. As a result $$\langle \hat{M}_N^2(\tau)\rangle = \{\cos h(2r)+\sin h(2r)\cos[2(\phi_h-\theta)]\}\kappa\tau. \quad (S19)$$

The noise is minimized by choosing θ according to $$\theta-\phi h=\frac{\pi}{2}\mathrm{mod}\pi.$$

With this choice, the SNR reads $$\mathrm{SNR}(r)=e^r\mathrm{SNR}(r=0). \quad (S20)$$

The SNR is thus exponentially enhanced, leading to Heisenberg-limited scaling.

A source of broadband pure squeezing is assumed to be available. The effect of a field squeezing bandwidth Γ was already studied elsewhere, it only leads to a small reduction of the SNR for Γ>>κ. On the other hand, deviation from unity of the squeezing purity P leads to a reduction of the SNR by $1/\sqrt{P}$. The SNR being decoupled from the anti-squeezed quadrature, the purity simply renormalizes the squeeze parameter.

C. Dispersive Coupling

For completeness, the SNR for dispersive readout is also provided, even though corresponding result may be found in the literature. In the dispersive regime, the qubit-cavity Hamiltonian reads $$\hat{H}=\omega_r\hat{a}^\dagger\hat{a}+\frac{1}{2}\omega_a\hat{\sigma}_z+\chi\hat{a}^\dagger\hat{a}\hat{\sigma}_z, \quad (S21)$$

where $\chi=g_x^2/\Delta$ is the dispersive shift. The Langevin equation of the cavity field in the interaction picture then reads $$\dot{\hat{a}}=-i\chi\hat{\sigma}_z\hat{a}-\frac{1}{2}\kappa\hat{a}-\sqrt{\kappa}\hat{a}_{in}. \quad (S22)$$

With a drive of amplitude $\epsilon=|\epsilon|e^{-i\varphi d}$ on the cavity at resonance, the input field is defined by its mean $\alpha_{in}=\langle\hat{a}_{in}\rangle=-\epsilon/\sqrt{\kappa}$ and fluctuations $\hat{d}_{in}=\hat{a}_{in}-\alpha_{in}$. Integrating the Langevin equation yields $$\alpha_{out}(t)=-\frac{\epsilon}{\sqrt{\kappa}}e^{-i\varphi_{qb}\langle\hat{\sigma}_z\rangle}\left[1-2\cos\left(\frac{1}{2}\varphi_{qb}\right)e^{-\left(i\chi\langle\hat{\sigma}_z\rangle+\frac{1}{2}\kappa\right)t+\frac{1}{2}i\varphi_{qb}\langle\hat{\sigma}_z\rangle}\right], \quad (S23)$$

$$\hat{d}_{out}(t)=\hat{d}_{in}(t)-\kappa\int_{-\infty}^t dt'e^{-\left(i\chi\langle\hat{\sigma}_z\rangle+\frac{1}{2}\kappa\right)(t-t')}\hat{d}_{in}(t'). \quad (S24)$$

where $\varphi_{qb}=2\arctan(2\chi/\kappa)$ is the qubit-induced phase of the output field. Moreover, the intracavity photon number is as $$\langle\hat{a}^\dagger\hat{a}\rangle=\left(\frac{2|\epsilon|}{\kappa}\right)^2\cos^2\left(\frac{1}{2}\varphi_{qb}\right)\left[1-2\cos(\chi t)e^{-\frac{1}{2}\kappa t}+e^{-\kappa t}\right]. \quad (S25)$$

From the above expressions, the measurement signal is $$M_{S,|1\rangle}-M_{S,|0\rangle}=4|\epsilon|\sin(\varphi_{qb})\sin(\varphi_d-\phi_h) \quad (S26)$$

$$\tau\left\{1-\frac{4}{\kappa\tau}\cos^2\left(\frac{1}{2}\varphi_{qb}\right)\left[1-\frac{\sin(\chi\tau+\varphi_{qb})}{\sin(\varphi_{qb})}e^{-\frac{1}{2}\kappa\tau}\right]\right\}$$

On the other hand, the measurement noise is simply equal to $\langle\hat{M}_N^2(\tau)\rangle=\kappa\tau$. The measurement signal is optimized for $$\varphi_d-\phi_h=\frac{\pi}{2}\mathrm{mod}\pi$$

and at long integration times by $$\varphi_{qb}=\frac{\pi}{2},$$

or equivalently $\chi=\kappa/2$. For this optimal choice, the SNR then reads

At long measurement times, the SNR evolves as $$SNR=\sqrt{8}\frac{|\epsilon|}{\kappa}\sqrt{\kappa\tau}$$

and at short measurement times it starts as:

$$SNR = \frac{1}{\sqrt{18}} \frac{|\epsilon|}{\kappa}(\sqrt{\kappa\tau})^{5/2} \quad (S27)$$

$$SNR = \sqrt{8}\frac{|\epsilon|}{\kappa}\sqrt{\kappa\tau}\left[1 - \frac{2}{\kappa\tau}\left(1 - e^{-\frac{1}{2}\kappa\tau}\cos\frac{1}{2}\kappa\tau\right)\right].$$

The presence of Purcell decay $\gamma_\kappa = (g/\Delta)^2\kappa$ is taken into account using the expression of $\langle\hat{\sigma}_z\rangle(t)$ for a Purcell-limited qubit, i.e., $\langle\hat{\sigma}_z\rangle(t) = (1 + \langle\hat{\sigma}_z\rangle(0))e^{-\gamma_\kappa t} - 1$. The $$SNR = \sqrt{2}\frac{|\epsilon|}{\kappa}\sqrt{\kappa\tau}\left\{1 - \frac{2}{\kappa\tau}\left(1 - e^{-\frac{1}{2}\kappa\tau}\cos\frac{1}{2}\kappa\tau\right) - \right. \quad (S28)$$
$$\left. \frac{\kappa}{\tau}\int_0^\tau dt\int_0^\tau dt' e^{-\frac{1}{2}\kappa(t-t')}\sin\left[\frac{1}{2}\kappa(t-t') - \frac{\kappa}{\gamma_\kappa}\left(e^{-\gamma_\kappa t'} - e^{-\gamma_\kappa t}\right)\right]\right\}.$$

corresponding SNR is then, for $\chi = \kappa/2$,

D. Effect of a Residual Transverse Coupling

In the fourth set of exemplary embodiments (D), presence of a spurious transverse coupling $g_x$ in addition to the longitudinal coupling $g_z$ is considered whereby:

$$\hat{H} = \omega_r\hat{a}^\dagger\hat{a} + \omega_a\hat{\sigma}_z + \{[\tilde{g}_x + \tilde{g}_x\cos(\omega_r t + \varphi_x)]\hat{\sigma}_x + [\tilde{g}_z + g_z\cos(\omega_r t + \varphi)]\hat{\sigma}_z\}(\hat{a}^\dagger + \hat{a}). \quad (S29)$$

It is now assumed that $g_x \ll \Delta$ and we follow the standard approach to eliminate the transverse coupling. To leading order in $g_x/\Delta$ and under the RWA, the interaction picture is defined as:

$$\tilde{H} = \frac{1}{2}(\chi_x - 2\chi_{xz})\hat{\sigma}_z + \chi\hat{a}^\dagger\hat{a}\hat{\sigma}_z + \frac{1}{2}[\tilde{g}_z\hat{a}^\dagger + \tilde{g}_z^*\hat{a}]\hat{\sigma}_z, \quad (S30)$$

with the dispersive shifts $\chi = \chi_x - 4\chi_{xz}$, $\chi_x = \bar{g}_x^2/\Delta$ and $\chi_{xz} = \bar{g}_x\bar{g}_z/\Delta$.

Going to an interaction picture also with respect to the first term of Equation (S30), the starting point is $$\tilde{H} = \chi\hat{a}^\dagger\hat{a}\hat{\sigma}_z + \frac{1}{2}[\tilde{g}_z\hat{a}^\dagger + \tilde{g}_z^*\hat{a}]\hat{\sigma}_z. \quad (S31)$$

This leads to the Langevin equation $$\hat{\dot{a}} = -i\frac{1}{2}\tilde{g}_z\hat{\sigma}_z - (i\chi + \frac{1}{2}\kappa)\hat{a} - \sqrt{\kappa}\hat{a}_{in}. \quad (S32)$$

In accordance with previously presented results in (A), the measurement signal is $$\langle\hat{M}\rangle_1 - \langle\hat{M}\rangle_0 = 4|\tilde{g}_z|\sin(\varphi - \phi_h)\tau\cos^2\left(\frac{1}{2}\varphi_{qb}\right) \quad (S33)$$
$$\left\{1 - \frac{2}{\kappa\tau}\left[\cos(\varphi_{qb}) - \cos(\varphi_{qb} + \chi\tau)e^{-\frac{1}{2}\kappa\tau}\right]\right\},$$

where as before it is noted that the dispersive-coupling-induced rotation $\varphi_{qb} = 2\arctan(2\chi/\kappa)$. Again as above, the measurement noise is not changed by the dispersive shift. Choosing $$\varphi - \phi_h = \frac{\pi}{2}\mathrm{mod}\,\pi,$$

the SNR finally reads $$SNR(\chi) = \quad (S34)$$
$$\sqrt{8}\frac{|\tilde{g}_z|}{\kappa}\sqrt{\kappa\tau}\cos^2\left(\frac{1}{2}\varphi_{qb}\right)\left\{1 - \frac{2}{\kappa\tau}\left[\cos(\varphi_{qb}) - \cos(\varphi_{qb} + \chi\tau)e^{-\frac{1}{2}\kappa\tau}\right]\right\}.$$

The residual dispersive coupling reduces the value of the SNR, with the decrease behaving differently at long and short measurement times. At long measurement times, the dispersive coupling reduces the SNR by $$SNR(\chi) \simeq \cos^2\left(\frac{1}{2}\varphi_{qb}\right)SNR(\chi = 0) = \frac{\kappa^2}{\kappa^2 + 4\chi^2}SNR(\chi = 0), \quad (S35)$$

for $\tau \gg 1/\kappa$.

The SNR is not affected for $\chi \ll \kappa/2$. Interestingly, at short measurement times the SNR is completely independent of the spurious dispersive shift to leading orders $$SNR(\chi) \simeq \frac{1}{\sqrt{2}}\frac{\tilde{g}_z}{\kappa}(\kappa\tau)^{3/2}\left(1 - \frac{1}{6}\kappa\tau\right), \text{ for } \tau \ll 1/\kappa. \quad (S36)$$

In short, the SNR is not affected by a spurious transverse coupling for short measurement times $\tau \ll 1/\kappa$.

II. Circuit QED Realization

An exemplary realization of longitudinal coupling in circuit QED is now addressed. While a lumped circuit QED implementation 700 is presented in FIG. 7, focus is on put a transmon qubit that is phase-biased by a coplanar waveguide resonator. The lumped element results are recovered in the appropriate limit. Emphasis is put on numerical results obtained for this coplanar realization. For this reason these numerical values differ from, but are compatible with, what is found with reference to FIGS. 1 to 9.

Figure 10:
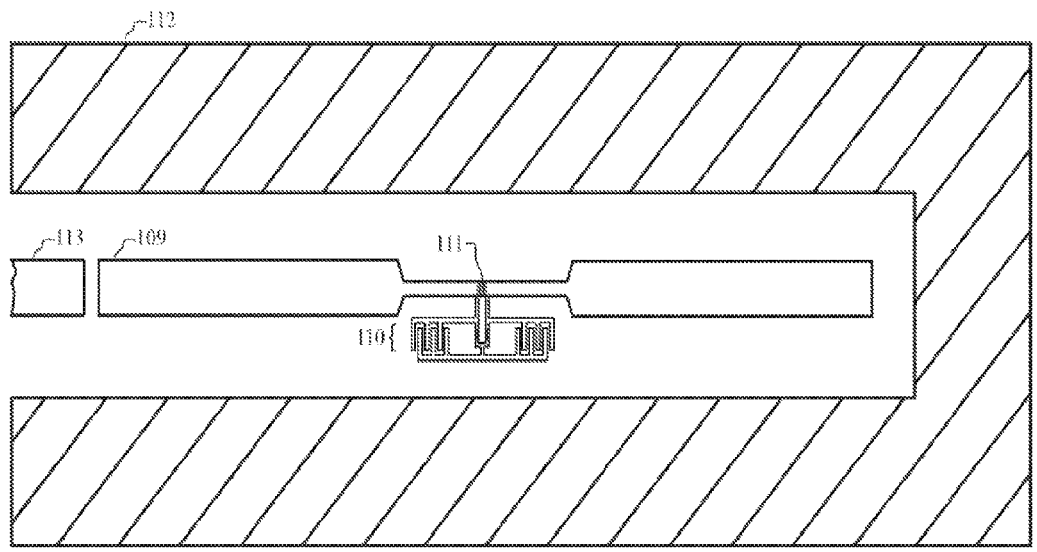
FIG. 10 is a logical representation of physical characteristics of a transmon qubit coupling longitudinally to a resonator.
Figure 11:
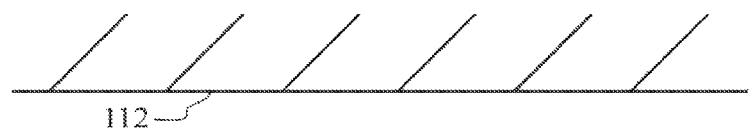
FIG. 11 is a close-up logical representation of physical characteristics of the transmon qubit.
Figure 11:
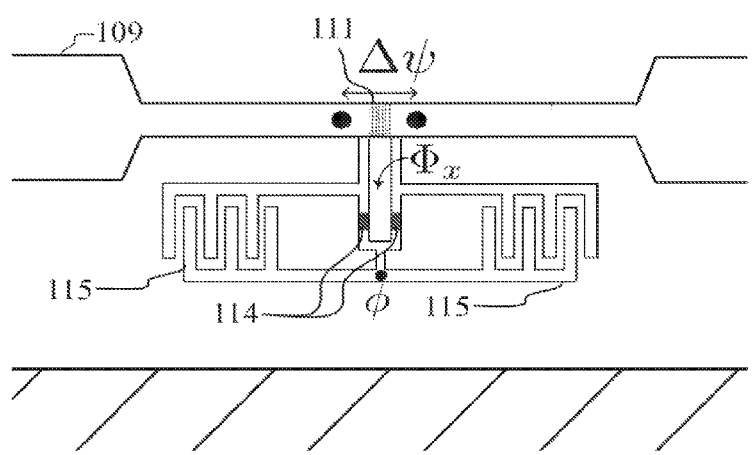

As illustrated in FIG. 10, a transmon qubit (110) coupled at middle of the center conductor of a $\lambda/2$ resonator (109). To increase the longitudinal coupling strength, a Josephson junction can be inserted in the center conductor of the resonator at the location of the qubit (111). FIG. 10 shows a logical representation of physical characteristics of a transmon qubit coupling longitudinally to a resonator. The coplanar waveguide resonator is composed of a central electrode (109) surrounded by a ground plane (112). A coupling inductance (111) mediates the longitudinal coupling to the transmon qubit (110). A capacitively coupled transmission line (113) allows to send and retrieve input and output signals to and from the resonator. FIG. 11 shows a close-up of the transmon qubit with the definitions of the branch fluxes used herein. The qubit is composed of nominally identical Josephson junctions (114) and large shunting capacitances (115). Additional control lines are needed to modulate the flux through the loop $\Phi_x$ and to perform single-qubit operations (not shown on FIG. 10 and FIG. 11). Ultrastrong transverse coupling of a flux qubit to a resonator has been presented by Bourassa, J. et. al. in "*Ultrastrong coupling regime of cavity QED with phase-biased flux qubits*", which involve at least some inventors also involved in an invention claimed herein. The modelling of the present circuit closely follows Bourassa, J. et. al. and relevant details are provided herein for completeness.

The Lagrangian of this circuit, $\mathcal{L} = \mathcal{L}r + \mathcal{L}q + \mathcal{L}qr$, is composed of three parts consisting of the bare resonator $\mathcal{L}r$, qubit $\mathcal{L}q$ and interaction $\mathcal{L}qr$ Lagrangians. From standard quantum circuit theory, the resonator Lagrangian takes the form $$\left(\frac{2\pi}{\Phi_0}\right)^2\mathcal{L}_r = \int_{-L/2}^{L/2}\left(\frac{C^0}{2}\dot{\psi}^2(x,t) - \frac{1}{2L^0}(\partial_x\psi(x,t))^2\right)dx + \quad (S37)$$

$$\left(\frac{2\pi}{\Phi_0}\right)^2 E_{Jr} \cos[\Delta\psi] + \frac{C_{Jr}}{2}\Delta\dot\psi.$$

where $\psi(x)$ is the position-dependant field amplitude inside the resonator and $\Delta\psi = \psi(x_a + \Delta x/2) - \psi(x_a + \Delta x/2)$ is the phase bias across the junction of width $\Delta x$ at position $x_a$. In this expression, it is assumed that the resonator has total length L with capacitance $C^0$ and inductance $L^0$ per unit length. In the single mode limit, $\psi(x,t) = \psi(t)u(x)$ where $u(x)$ is the mode envelope. The Josephson junction in the resonator's center conductor has energy $E_{Jr}$ and capacitance $C_{Jr}$. This junction creates a discontinuity $\Delta\psi \neq 0$ in the resonator field that will provide the desired longitudinal interaction. The coupling inductance can be replaced by a SQUID, or SQUID array, without significant change to the treatment. This Lagrangian was already studied in the context of strong transverse coupling flux qubits to transmission-line resonators and for non-linear resonators.

The transmon qubit is composed of a capacitor to ground $C_b$ and two capacitively shunted Josephson junctions of energies $E_{J1}$ and $E_{J2}$, and total capacitances $C_{q1} = C_{j1} + C_{s1}$ and $C_{q2} = C_{j2} + C_{s2}$ respectively. In terms of the branch fluxes defined on FIG. 11, the qubit Lagrangian taking into account the coupling to the resonator is $$\mathcal{L}_q + \mathcal{L}_{qr} = \left(\frac{\Phi_0}{2\pi}\right)^2 \left[\frac{C_{q1}}{2}(\dot\psi_1 - \dot\phi - \dot\Phi_x)^2 + \frac{C_{q2}}{2}(\dot\psi_2 - \dot\phi)^2 + \frac{C_b}{2}\dot\phi^2\right] + \quad \text{(S38)}$$
$$E_{J1}\cos[\psi_1 - \phi - \Phi_x] + E_{J2}\cos[\psi_2]$$

Here $\psi_{1(2)} = \psi(x_a \mp \Delta_x/2)$ is defined for simplicity and the qubit capacitances $C_q = C_j + C_s$ for each arm. Defining new variables $\theta = (\psi_1 + \psi_2 - 2\phi)/2$ and $\delta = (\psi_1 + \psi_2 + 2\phi)/2$, the above is obtained $$\mathcal{L}_q + \mathcal{L}_{qr} = \quad \text{(S39)}$$
$$\left(\frac{\Phi_0}{2\pi}\right)^2 \left[\frac{C_{q1} + C_{q2}}{2}(\dot\theta^2 + \Delta\dot\psi^2/4) + \frac{C_b}{8}(\dot\delta - \dot\theta)^2 + \frac{(C_{q1} - C_{q2})}{2}\dot\theta\Delta\dot\psi\right] +$$
$$E_{J1}\cos[\theta - \Delta\psi/2 + \Phi_x] + E_{J2}\cos[\theta - \Delta\psi/2].$$

Shifting the variable $\theta \rightarrow \theta + \Phi_x/2$, a more symmetrical Lagrangian is obtained with respect to the external flux $$\mathcal{L}_q + \mathcal{L}_{qr} = \quad \text{(S40)}$$
$$\left(\frac{\Phi_0}{2\pi}\right)^2 \left[\frac{C_{q1} + C_{q2}}{2}\left(\dot\theta^2 + \frac{\Delta\dot\psi^2 + \dot\Phi_x^2}{4}\right) + \frac{C_b}{8}(\dot\delta - \dot\theta - \dot\Phi_x/2)^2 +\right.$$
$$\left.\frac{(C_{q1} - C_{q2})}{2}\dot\theta(\dot\Phi_x - \Delta\dot\psi) + \frac{C_{q1} + C_{q2}}{4}\Delta\dot\psi\dot\Phi_x\right] +$$
$$E_{J1}\cos[\theta - \Delta\psi/2 - \Phi_x/2] + E_{J2}\cos[\theta + \Delta\psi/2 + \Phi_x/2].$$

The equation of motion for $\delta$ being $\ddot\delta - \ddot\theta + \ddot\Phi_x/2 = 0$, the term involving the capacitance to ground $C_b$ is thus a constant and can be ignored. Assuming the resonator phase-bias to be small $\Delta\psi \ll 1$ and a DC-flux bias ($\dot\Phi_x = 0$), we find to zeroth-order in $\Delta\psi$ the usual Lagrangian of an asymmetric fluxbiased transmon qubit $$\mathcal{L}_q = \left(\frac{\Phi_0}{2\pi}\right)^2 \frac{C_{q1} + C_{q2}}{2}\dot\theta^2 + E_{J\Sigma}[\cos(\Phi_x/2)\cos\theta - d\sin(\Phi_x/2)\sin\theta], \quad \text{(S41)}$$

where $E_{J\Sigma} = E_{J1} + E_{J2}$ and $d = (E_{J2} - E_{J1})/E_{J\Sigma}$ is the junction asymmetry. Defining $\hat{n}$ to be the conjugate charge to $\hat\theta$, the corresponding Hamiltonian is $$\hat{H}_q = 4E_C\hat{n}^2 - E_{J\Sigma}[\cos(\Phi_x/2)\cos\hat\theta - d\sin(\Phi_x/2)\sin\hat\theta], \quad \text{(S42)}$$

with the charging energy $E_C = e^2/2(C_{q1} + C_{q2})$.

For clarity, projection is made on the qubit subspace $\{|0\rangle, |1\rangle\}$ where the total Hamiltonian takes the form $$\hat{H} = \omega_r \hat{a}^\dagger \hat{a} + K(\hat{a}^\dagger \hat{a})^2 + \frac{\omega_a}{2}\hat\sigma_z + \hat{H}_{qr}. \quad \text{(S43)}$$

In this expression, $\omega_a$ is the qubit transition frequency and K the Kerr non-linearity. The latter can be made small and in particular negligible with respect to the photon decay rate $\kappa$. To first order in $\Delta\hat\psi$ and in the same two-level approximation, the interaction Hamiltonian reads $$\hat{H}_{qr} = E_{J\Sigma}\frac{\Delta\hat\psi}{2}\left[\sin(\Phi_x/2)\cos\hat\theta + d\cos(\Phi_x/2)\sin\hat\theta\right] \quad \text{(S44)}$$
$$= g_z(\hat{a}^\dagger + \hat{a})\hat\sigma_z + g_x(\hat{a}^\dagger + \hat{a})\hat\sigma_x,$$

where $$g_z(\Phi_x) = -\psi_{rms}\Delta u \frac{E_{J\Sigma}}{4}[m_{11}(\Phi_x) - m_{00}(\Phi_x)], \quad \text{(S45)}$$

$$g_x(\Phi_x) = \psi_{rms}\Delta u \frac{E_{J\Sigma}}{2}m_{01}(\Phi_x). \quad \text{(S46)}$$

To obtain these expressions, $\Delta\hat\psi = \Delta u\psi_{rms}(\hat{a}^\dagger + \hat{a})$ is used, with $\psi_{rms} = \sqrt{4\pi Z_r/R_K}$. Here $Z_r$ is the resonator mode impedance and $R_K = h/e^2$ the quantum of resistance. The mode gap $\Delta u$ is found to be optimal for a junction placed in the center of the resonator center (see Bourassa, J. et. al.). At that location, $\Delta u$ can be related to the participation ratio of the coupling inductance $L_J^{-1} = E_{Jr}(2\pi/\phi_0)^2$ to the effective inductance of the resonator mode $L_r$ as $\Delta u \approx 2\eta = 2L_J/L_r$. The factor of two originates from the fact that both resonator halves bias equally the qubit. The lumped element limit discussed in the previous discussion is obtained for $\eta \rightarrow \frac{1}{2}$. Moreover, it has been defined that $m_{ij} = \langle i|\sin(\Phi_x/2)\cos\hat\theta + d\cos(\Phi_x/2)\sin\hat\theta|j\rangle$. Equations (S46) and (S45) are calculated numerically by diagonalizing the transmon Hamiltonian.

B. Numerical Evaluation of the Coupling Strength

A set of possible parameters is presented for this circuit. It is very important to emphasize that these numbers relate to the coplanar architecture discussed here and not to the lumped-element example described in relation to FIGS. 7 to 9. A $\lambda/2$ resonator is used of characteristic impedance $Z^0 \sim 50\Omega$, total length 7.6 mm and capacitance per unit length $C^0 = 0.111$ nF/m and inductance per unit length $L^0 = 0.278$ μH/m. The coupling inductance consists of an array of 13 Josephson Junctions with a total Josephson energy $E_{Jr}/h = 420$ GHz. Following the standard procedure, the first resonator mode is determined to be at frequency $\omega_r/2\pi = 10.02$ GHz, with a characteristic mode impedance $Z_r = 18.8\Omega$. The participation ratio of the array is found to be $\eta \sim 0.3$. With these parameters, the resonator bias on the qubit is $\psi_{rms} \approx 0.096$.

The transmon Josephson and charging energies are $E_{J\Sigma}/h=20$ GHz and $E_c/h=0.3$ GHz respectively, and the asymmetry $d=0.02$. These parameters yield $\omega_a/2\pi=6.6$ GHz when evaluated at the flux sweet-spot $\Phi_x=0$. The magnetic flux is modulated around this flux value with a maximum excursion of $\tilde{\Phi}_x/2\pi=0.1$. At the sweet-spot, the qubit-resonator is $\Delta=\omega_a(0)-\omega_r\approx 2\pi\times 3.4$ GHz. The longitudinal coupling $\tilde{g}_z$ the various spurious interactions found numerically using these numbers are summarized in Table I, which provides longitudinal coupling rate $\tilde{g}_z$ and spurious leading-order and second-order couplings for a transmon coupled to a $\lambda/2$ resonator with a coupling inductance consisting of an array of 13 Josephson junctions as discussed herein above with reference to the coplanar architecture (i.e., not in relation to the lumped element version discussion in FIGS. 7 to 9).

| Couplings | | Rates ($2\pi \times$ MHz) |
|---|---|---|
| Longitudinal [Eq. (S48)] | $\tilde{g}_z$ | 26.3 |
| Transverse [Eq. (S49)] | $g_x$ | 7.89 |
| Dispersive | $g_x^2/\Delta$ | 0.018 |
| Non-linear dispersive [Eq. (S56)] | $2\overline{\lambda}_z$ | 3.97 |
| Non-linear transverse [Eq. (S57)] | $\overline{\lambda}_x$ | 0 |
| Kerr nonlinearity | K | 0.007 |
| Qubit frequency shift (from flux-drive) [Eq. (S54)] | $\epsilon_q^2/\Delta$ | $4.4 \times 10^{-5}$ |

In particular, $\tilde{g}_z/2\pi=26.3$ MHz and a small transverse coupling resulting in a negligible dispersive shift $\chi_x=g_x^2/\Delta\sim 18$ kHz. The maximum change in qubit frequency is $\omega_a(0)-\omega_a(\tilde{\Phi}_x)\sim 2\pi\times 170$ MHz.

The array of N junctions allows for strong longitudinal coupling while reducing the resonator nonlinearity. Compared to a single junction of equal energy, the non-linear Kerr effectively decreases as $K=K_1/N^2$ and from the parameters above $K/2\pi=7$ kHz using 13 junctions is obtained.

C. Asymptotic Expression for the Coupling Strengths

To obtain asymptotic expressions for the qubit-resonator coupling, the transmon is considered as a weakly anharmonic oscillator. In this situation, $$\hat{\theta} \approx \left[\frac{2E_C}{E_J(\Phi_x)}\right]^{1/4}(\hat{b}^\dagger+\hat{b}) \tag{S47}$$

and $$m_{i,j\neq i} \approx d\left(\frac{2E_C}{E_J(\Phi_x)}\right)^{1/4} \cos(\Phi_x/2)\langle i|(\hat{b}^\dagger+\hat{b})|j\rangle,$$

$$m_{ii} \approx -\left(\frac{2E_C}{E_J(\Phi_x)}\right)^{1/2} \frac{\sin(\Phi_x/2)}{2}\langle i|(\hat{b}^\dagger+\hat{b})^2|i\rangle$$

Restricting to the $\{|0\rangle, |1\rangle\}$ subspace and using Equations (S46) and (S45), the asymptotic expressions obtained are $$g_z \approx -\frac{E_{J\Sigma}}{2}\left[\frac{2E_C}{E_J(\Phi_x)}\right]^{1/2}\sqrt{\frac{\pi Z_r}{R_K}}\sin(\Phi_x/2)2\eta, \tag{S48}$$

$$g_x \approx dE_{J\Sigma}\left[\frac{2E_C}{E_J(\Phi_x)}\right]^{1/4}\sqrt{\frac{\pi Z_r}{R_K}}\cos(\Phi_x/2)2\eta. \tag{S49}$$

These correspond to Equations 5 and 6 previously discussed where $\eta > \frac{1}{2}$.

D. Upper Bounds on the Coupling Strength

An upper bounds for the longitudinal coupling is obtained by expressing $g_z$ in units of the qubit frequency. Using Equation S48:

$$\frac{g_z}{\omega_a} \approx \frac{\Phi_x}{8}\sqrt{\frac{\pi Z_r}{R_K}}2\eta. \tag{S50}$$

For $Z_r\sim 50\Omega$ resonator, maximal coupling is reached in the lumped-element limit of the oscillator where $\eta\to\frac{1}{2}$ and we get $g_z/\omega_a\sim 0.006$, or about twice the coupling obtained in the previous example giving $g_z/2\pi\sim 42.4$ MHz.

Even larger values of $g_z$ can be achieved by using lumped LC-circuit comprises of a superinductance of large impedance $Z_r\sim R_K/4$. For participation ratios in the range $2\eta\sim[10^{-2}, 1]$, the coupling is enhanced by a factor of $\sim 10$ to $g_z/\omega_a=\Phi_x\eta\sqrt{\pi}/8\sim[7\times 10^{-4}, 7\times 10^{-2}]$. While the previous circuit model would have to be redefined to take the large bias $\Delta\psi$ into account, it is safe to say that the larger and more compact coupling inductance is, the stronger the longitudinal coupling will be.

III. Spurious Couplings and Imperfections

From the first term in Equation (S39), an oscillating external magnetic flux $\Phi_x(t)=\tilde{\Phi}_x\cos(\omega_d t+\varphi)$ at frequency $\omega_d$ leads to an effective voltage driver on the resonator $$\mathcal{L}_{r,drive} = \left(\frac{\Phi_0}{2\pi}\right)^2 \frac{C_{q1}+C_{q2}}{2}\dot{\Phi}_x\dot{\psi}(0). \tag{S51}$$

$$\epsilon_r = \frac{\hbar\omega_r}{16E_{CJ}}\psi_{rms}\Phi_x\omega_d, \tag{S52}$$

This term leads to an effective driver on the resonator $\hat{H}_{r,d}=\epsilon_r e^{-i(\omega_s t+\varphi)}\hat{a}^\dagger$+H.c. of drive amplitude $\epsilon_r$ where $E_{CJ}=e^2/[2(C_{q1}+C_{q2})]$. With the above circuit, parameters, $\epsilon_r/2\pi\sim 5$ MHz is obtained. If desired, the effect of this drive can be cancelled by an additional drive on the input port of the resonator. Otherwise, this simply leads to an additional qbit-state independent displacement of the cavity field that does not affect the SNR.

In the same way, flux modulation also directly drives the qubit. This is caused by the last charging energy term of Equation (S39) and yields $$\hat{H}_{q,d} = \left(\frac{\Phi_0}{2\pi}\right)^2 \frac{C_{q2}-C_{q1}}{2}\dot{\Phi}_x\hat{q}, \tag{S53}$$

From the asymptotic expression $\hat{q}\approx i(E_J/32E_C)^{1/4}(\hat{b}^\dagger-\hat{b})$, $\hat{H}_{q,d}=\epsilon_q e^{-i(\omega_r t+\varphi)}\hat{b}^\dagger$+H.c. is obtained where $$\epsilon_q \approx \frac{d}{8}\frac{C_J}{C_\Sigma}\left(\frac{E_J}{32E_C}\right)^{1/4}\Phi_x\omega_r \tag{S54}$$

is identically zero for symmetric junctions (d=0). With the above parameters and $C_J=C_\Sigma=0.01$, then $\epsilon_q/2\pi\approx0.18$ MHz. Given the strong qubit-resonator detuning of several GHz, this is however of no consequences.

B. Higher-Order Interaction Terms

To second order in $\Delta\psi$ in Equation (S39) yields the additional interactions $$\hat{H}^{(2)}_{q,r} = (\hat{a}^\dagger + \hat{a})^2(\Lambda_x\hat{\sigma}_x + \Lambda_z\hat{\sigma}_z), \quad (S55)$$

where $$\Lambda_z = \psi^2_{rms}\frac{E_{J\Sigma}}{16}(\langle 0|\hat{c}c - d\,\hat{s}s|0\rangle - \langle 1|\hat{c}c - d\,\hat{s}s|1\rangle), \quad (S56)$$

$$\Lambda_x = \psi^2_{rms}\frac{E_{J\Sigma}}{8}\langle 1|[\hat{c}c - d\,\hat{s}s]|0\rangle, \quad (S57)$$

and where have been defined $\hat{c}c=\cos(\Phi_x 2)\cos\hat{\theta}$ and $\hat{s}s=\sin(\Phi_x 2)\sin\hat{\theta}$.

Under flux modulation, $\Lambda_k(t)=\tilde{\Lambda}_k+\tilde{\Lambda}_k\cos(\omega_r t+\varphi_r)$ with $k=x,z$. With the RWA this leads to $$\hat{H}_{qr}^{(2)}\approx(2\hat{a}^\dagger\hat{a}+1)(\tilde{\Lambda}_x\hat{\sigma}_x+\tilde{\Lambda}_z\hat{\sigma}_z). \quad (S58)$$

For d small and flux modulations around $\Phi_x=0$ then $\overline{\Lambda}_x=0$. On the other hand, the dispersive-like interaction of amplitude $\chi_z=2\overline{\Lambda}_z$ has a magnitude of $\chi_z/2\pi\approx3.97$ MHz for the above circuit parameters. In the lumped-element limit with $Z_r=50\Omega$, the result is $\chi_z/2\pi=5.3$ MHz. Since this dispersive-like interaction originates from a second-order correction, it is always found that $g_z/\chi_z\approx10$. In practice, choosing $\chi_z<\kappa$ will allow this spurious coupling will not affect the SNR at short integration times.

IV. Multiple Qubit Read-Out in (X+Z) Circuit QED

Figure 12:
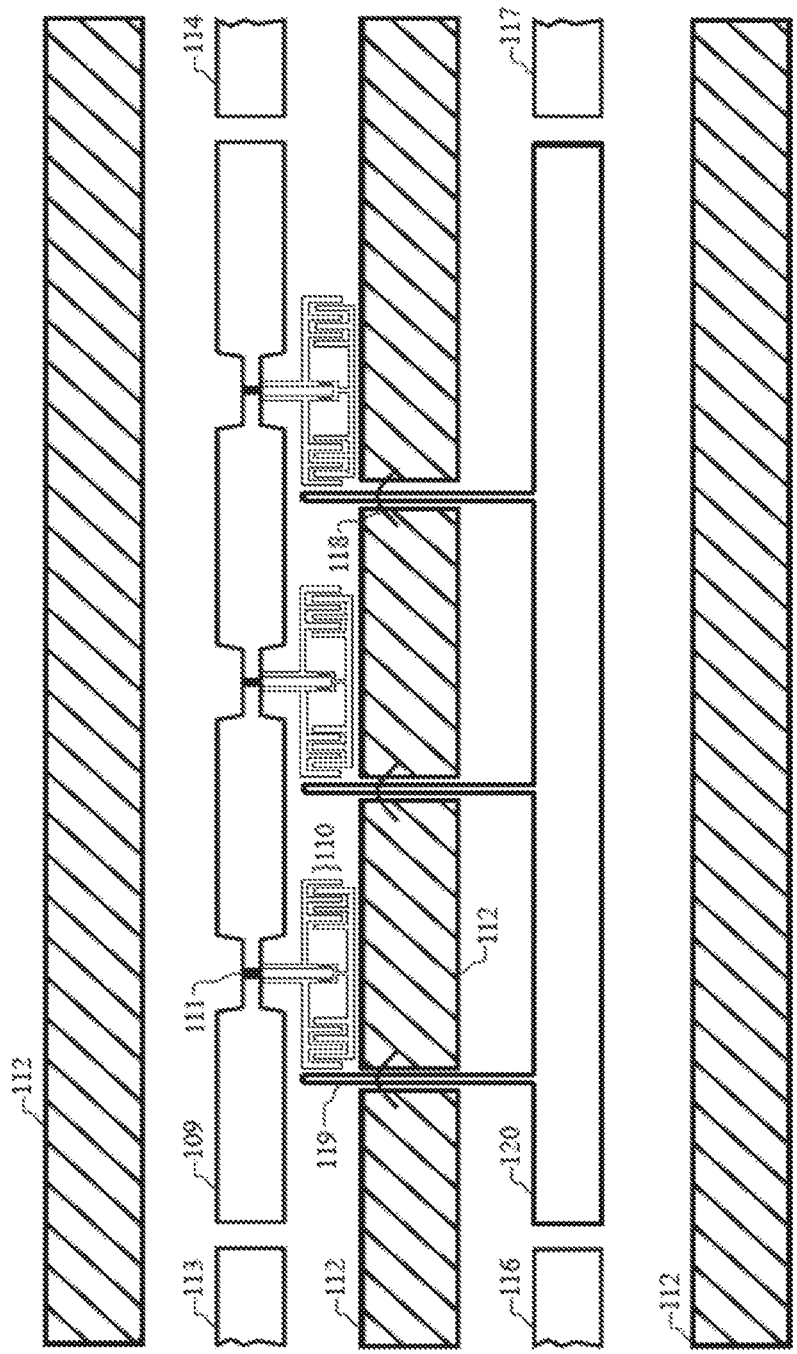
FIG. 12 is a logical representation of physical characteristics of a multi-qubit architecture.
Figure 13A:
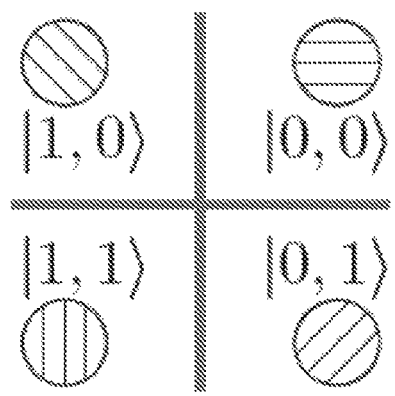
FIGS. 13A, 13B, 13C and 13D are phase space representation of pointer states for multiple qubits.
Figure 13B:
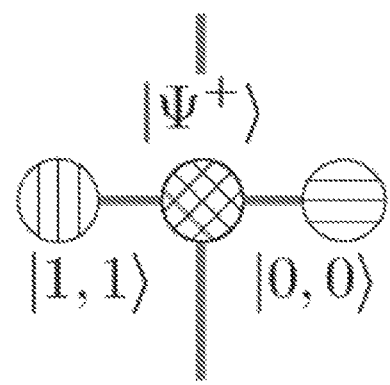
Figure 13C:
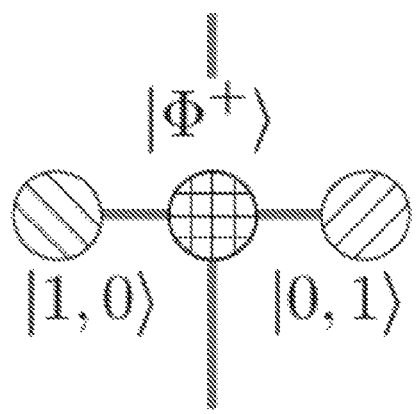
Figure 13D:
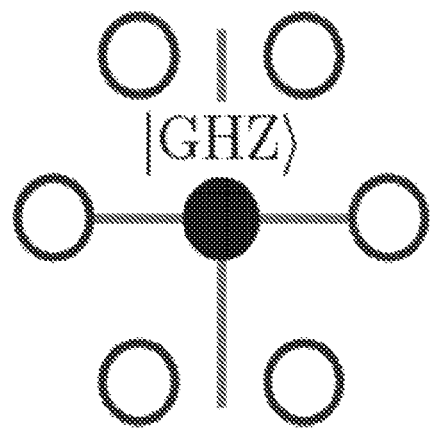

FIG. 12 illustrates a possible multi-qubit architecture: qubits (110) are longitudinally coupled to a readout resonator (109) and transversally coupled to a bus resonator (120). The readout resonator is used only when the longitudinal couplings are modulated and individual flux control for each qubit is possible with separated flux lines. The system Hamiltonian reads $$\hat{H} = \omega_{rz}\hat{a}^\dagger_z\hat{a}_z + \omega_{rx}\hat{a}^\dagger_x\hat{a}_x + \sum_j \frac{1}{2}\omega_{aj}\hat{\sigma}_{zj} + \sum_j g_{zj}\hat{\sigma}_{zj}(\hat{a}^\dagger_z+\hat{a}_z) + \sum_j g_{xj}\hat{\sigma}_{xj}(\hat{a}^\dagger_x+\hat{a}_x). \quad (S59)$$

In the interaction picture and neglecting fast-oscillating terms, the longitudinal coupling becomes $$\hat{H}_z = \left(\frac{1}{2}\tilde{g}_z\sum_j\hat{\sigma}_{zj}e^{-i\varphi_j}\right)\hat{a}_z + H.c. \quad (S60)$$

The position of the qubits and the coupling inductances can be adjusted to get equal longitudinal coupling strengths $|g_{zj}|$. By properly choosing the phases $\varphi_j$, it is possible to operate in the joint qubit readout mode or in the entanglement by measurement mode. Examples for 2 and 3 qubits are shown in FIGS. 13A, 13B, 13C and 13D (joint measurement of two qubits, synthesis of Bell states and 3-qubit GHZ state by measurement).

FIG. 12 shows a multi-qubit architecture consisting of qubits (110) longitudinally coupled to a readout resonator (109) and transversally coupled to a bus resonator (120) by way of bus-resonator fingers (119) capacitively coupled to the qubits. As in FIG. 10, the read-out resonator is coupled to an input transmission-line (113) but also to and output transmission-line (114). Similarly, the bus resonator is connected to both an input (116) and output (117) transmission-line for control. The ground plane (112) is placed on both sides of the resonators. Between the qubits (110), the pieces of ground planes are interconnected with air bridges (118). Flux control lines and qubit controls lines for each qubit are absent in this figure. FIGS. 13A, 13B, 13C and 13D show phase space representation of the pointer states for two and three qubits. On FIG. 13A, two-qubit joint readout ($\varphi_j=j\pi/2$). On FIGS. 13B and 13C, two-qubit entanglement by measurement is depicted. The double-hatched circles centered at the origin circles correspond to the Bell states $$|\Psi^+\rangle = \frac{1}{\sqrt{2}}[|0,1\rangle+|1,0\rangle]$$

and $$|\Phi^+\rangle = \frac{1}{\sqrt{2}}[|0,0\rangle+|1,1\rangle],$$

obtained for $\varphi_j=0$ and $\varphi_j=j\pi$, respectively. On FIG. 13D, the centered at the origin circle corresponds to the GHZ state $$|GHZ\rangle = \frac{1}{\sqrt{2}}[|0,0,0\rangle+|1,1,1\rangle].$$

This configuration is obtained for $\varphi_j=j2\pi/3$

V. Qubit Dephasing

When not measuring the qubit, coupling to the resonator is turned off and the qubit is not dephased by photon shot noise or residual thermal population. In the superconducting qubit architecture studied in the previous section, another potential source of dephasing is flux noise. The influence of low-frequency flux noise on the transmon was already studied. Since the qubit is operated at its flux sweet spot, the effect of this noise can be negligible.

More interesting here is the contribution opened by the longitudinal coupling, that is flux noise at the resonator frequency which will effectively 'measure' the qubit. Following the standard procedure and using Equation (5) previously defined, in the presence of flux noise, longitudinal coupling leads to a decay of the qubit's off-diagonal density matrix element with $$\rho_{01}(t) = \quad (S61)$$

$$\rho_{01}(0)e^{i\omega_a t}\exp\left\{-\frac{\lambda^2}{2}\int_{-\infty}^{+\infty}\frac{d\omega}{2\pi}S_\Phi(\omega+\omega_r)\left[(2\bar{n}+1)\frac{\sin^2(\omega t/2)}{\omega^2} + 2\bar{m}\cos(\omega_r t-\theta)\frac{\sin(\omega t/2)\sin((\omega+2\omega_r)t/2)}{\omega(\omega+2\omega_r)}\right]\right\}.$$

In this expression, $S_\Phi(\omega)$ is the spectral density of flux noise, $\bar{n}=\langle\hat{a}^\dagger\hat{a}\rangle$, $\bar{m}e^{i\theta}=\langle\hat{a}^2\rangle$ and $$\lambda = \frac{\partial g_z}{\partial \Phi_x}\bigg|_{\Phi_x=0} = -\frac{\pi}{\Phi_0}\frac{E_J}{2}\left(\frac{2E_C}{E_J}\right)^{1/2}\sqrt{\frac{\pi Z_0}{R_K}}. \quad (S62)$$

The term in $\rho_{01}(t)$ not proportional to $\bar{n}$ or $\bar{m}$ takes the standard form, with the crucial difference that here the noise spectral density is evaluated at $\omega+\omega_r$ rather than at $\omega$. With $S_\Phi(\omega)=2\pi A^2/|\omega|^\alpha$ even at large frequencies, dephasing caused by longitudinal coupling is therefore expected to be negligible. In practice, the terms proportional to $\bar{n}$ or $\bar{m}$ are expected to contribute only in the situation where the intra-cavity field would be squeezed prior to the qubit measurement. In this situation, $\bar{n}=\sin h^2 r$ and $\bar{m}=-\sin h(2r)/2$ with r the squeeze parameter.

Although decay is not exponential, the dephasing time can be estimated from the above expression by using the 1/e threshold as an estimate. For this an infrared cutoff must be introduced. Fortunately, the end result is only weakly dependent on this cutoff. For simplicity $\alpha=1$ is taken in the noise spectral density with $A=10^{-5}\Phi_0$. Using the parameters given in the text, in the absence of squeezing but with a large spurious photon number $\bar{n}=0.1$ a very large dephasing time of $\sim 10^2$ seconds is found. For a squeezed state of 20 dB a dephasing time larger than a second is found. This mechanism is clearly not limiting the qubit dephasing time.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A circuit quantum electrodynamics (circuit QED) implementation of a quantum information unit (qubit) memory having a qubit frequency $\omega_a$ and holding a value $\hat{\sigma}_z$, the circuit QED implementation comprising:
    a resonator defined by:
        a resonator damping rate $\kappa$;
        a resonator frequency $\omega_r$;
        a resonator electromagnetic field characterized by $\hat{a}^\dagger$ and $\hat{a}$;
        a longitudinal coupling strength $g_z$;
        an output $\hat{a}_{out}$;
        a quantum non-demolition (QND) longitudinal coupling $g_z\hat{\sigma}_z(\hat{a}^\dagger+\hat{a})$; and
    a modulator periodically modulating the longitudinal coupling strength $g_z$ with a signal of amplitude $\tilde{g}_z$ greater than or equal to the resonator damping rate $\kappa$ and of frequency $\omega_m$ with $\omega_m\pm\kappa$ resonant with $\omega_r\pm$ a correction factor, wherein the correction factor is smaller than $|\omega_r/10|$ and the longitudinal coupling strength $g_z$ varies over time (t) in accordance with:

$g_z(t)=\bar{g}_z+\tilde{g}_z\cos(\omega_m t)$ with $\bar{g}_z$ representing an average value of $g_z$; and a homodyne detector for measuring the value $\hat{\sigma}_z$ of the qubit memory from a reading of the output $\hat{a}_{out}$.

2. The circuit QED implementation of claim 1, wherein the correction factor is between 0 and $|\omega_r/100|$.

3. The circuit QED implementation of claim 1, the homodyne detector is for measuring the value $\hat{\sigma}_z$ of the qubit memory from a phase reading of the output $\hat{a}_{out}$.

4. The circuit QED implementation of claim 1, wherein the signal amplitude $\tilde{g}_z$ is at least three (3) times greater than the resonator damping rate $\kappa$ or wherein the signal amplitude $\tilde{g}_z$ is at least ten (10) times greater than the resonator damping rate $\kappa$.

5. The circuit QED implementation of claim 1, further comprising a signal injector providing a single-mode squeezed input on the resonator such that noise on the phase reading from the output $\hat{a}_{out}$ is reduced while noise is left to augment on one or more interrelated characteristics of the output $\hat{a}_{out}$.

6. The circuit QED implementation of claim 3, wherein the average value of $g_z$, $\bar{g}_z=0$ and the single-mode squeezed input is QND.

7. The circuit QED implementation of claim 1, wherein the qubit memory is a transmon comprising two Josephson junctions with substantially equivalent capacitive values and the longitudinal modulator comprises an inductor-capacitor (LC) oscillator with a phase drop $\delta$ across a coupling inductance placed between the two Josephson junctions, the longitudinal coupling resulting from mutual inductance between the oscillator and the transmon, the oscillator varying a flux $\Phi_x$ in the transmon.

8. The circuit QED implementation of claim 7, wherein the transmon has a flux sweet spot at integer values of a magnetic flux quantum $\Phi_0$, Josephson energy asymmetry of the transmon is below 0.02 and $\Phi_x$ varies by $\pm 0.05\Phi_0$ around $\Phi_x=0$.

9. The circuit QED implementation of claim 7, wherein a 3-Wave mixing Josephson dipole element is used to couple the qubit and the resonator.

10. The circuit QED implementation of claim 6, wherein the resonator is detuned from the qubit frequency $\omega_a$ by $|\Delta|\geq\tilde{g}_z$.

11. The circuit QED implementation of claim 6, wherein the oscillator inductance is provided by an array of Josephson junctions or by one or more Superconducting Quantum Interference Device (SQUID).

12. A method for reading a value $\hat{\sigma}_z$ stored in a quantum information unit (qubit) memory having a qubit frequency $\omega_a$, with a resonator defined by a resonator damping rate $\kappa$, a resonator frequency $\omega_r$, a resonator electromagnetic field characterized by $\hat{a}^\dagger$ and $\hat{a}$, a longitudinal coupling strength $g_z$, an output $\hat{a}_{out}$ and a quantum non-demolition (QND) longitudinal coupling $g_z\hat{\sigma}_z(\hat{a}^\dagger+\hat{a})$, the method comprising:
    at a modulator, periodically modulating the longitudinal coupling strength $g_z$ with a signal of amplitude $\tilde{g}_z$ greater than or equal to the resonator damping rate $\kappa$ and of frequency $\omega_m$ with $\omega_m\pm\kappa$ resonant with $\omega_r\pm$ a correction factor, wherein the correction factor is smaller than $|\omega_r/10|$ and the longitudinal coupling strength $g_z$ varies over time (t) in accordance with:

$g_z(t) = \bar{g}_z + \tilde{g}_z \cos(\omega_m t)$ with $\bar{g}_z$ representing an average value of $g_z$; and at a homodyne detector, measuring the value $\hat{\sigma}_z$ of the qubit memory from a reading of the output $\hat{a}_{out}$.

13. The method of claim 12, wherein the signal amplitude $\tilde{g}_z$ is at least three (3) times greater than the resonator damping rate $\kappa$ or wherein the signal amplitude $\tilde{g}_z$ is at least ten (10) times greater than the resonator damping rate $\kappa$.

14. The method of claim 12, further comprising, from a signal injector, providing a single-mode squeezed input on the resonator such that noise on the phase reading from the output $\hat{a}_{out}$ is reduced while noise is left to augment on one or more interrelated characteristics of the output $\hat{a}_{out}$.

15. The method of claim 14, wherein the average value of $g_z$, $\bar{g}_z = 0$ and the single-mode squeezed input is QND.

16. The method of claim 12, wherein the qubit memory is a transmon comprising two Josephson junctions with substantially equivalent capacitive values and the longitudinal modulator comprises an inductor-capacitor (LC) oscillator with a phase drop $\delta$ across a coupling inductance placed between the two Josephson junctions, the longitudinal coupling resulting from mutual inductance between the oscillator and the transmon, the oscillator varying a flux $\Phi_x$ in the transmon.

17. The method of claim 16, wherein the transmon has a flux sweet spot at integer values of a magnetic flux quantum $\Phi_0$, Josephson energy asymmetry of the transmon is below 0.02 and $\Phi_x$ varies by $\pm 0.050\Phi_0$ around $\Phi_x = 0$.

18. The method of claim 16, further comprising detuning the resonator from the qubit frequency $\omega_a$ by $|\Delta| \geq \tilde{g}_z$.

19. The method of claim 16, wherein a 3-Wave mixing Josephson dipole element is used to couple the qubit $Q_1$ and the resonator $R_a$.

20. The method of claim 16, wherein the oscillator inductance is provided by an array of Josephson junctions or wherein the oscillator inductance is provided by one or more Superconducting Quantum Interference Device (SQUID).

* * * * *